US006377070B1

(12) United States Patent
Forbes

(10) Patent No.: US 6,377,070 B1
(45) Date of Patent: Apr. 23, 2002

(54) IN-SERVICE PROGRAMMABLE LOGIC ARRAYS WITH ULTRA THIN VERTICAL BODY TRANSISTORS

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/780,129

(22) Filed: Feb. 9, 2001

(51) Int. Cl.[7] .............................................. H01L 25/00
(52) U.S. Cl. ......................... 326/41; 326/101; 326/102
(58) Field of Search .............................. 326/38, 39, 41, 326/44, 45, 47, 49, 102, 103, 101

(56) References Cited

U.S. PATENT DOCUMENTS

| | | | |
|---|---|---|---|
| 5,691,230 A | 11/1997 | Forbes | 437/62 |
| 5,936,274 A | 8/1999 | Forbes et al. | 257/315 |
| 5,973,356 A | 10/1999 | Noble et al. | 257/319 |
| 5,991,225 A | 11/1999 | Forbes et al. | 365/230.06 |
| 6,072,209 A | 6/2000 | Noble et al. | 257/296 |
| 6,124,729 A | 9/2000 | Noble et al. | 326/41 |
| 6,150,687 A | 11/2000 | Noble et al. | 257/302 |
| 6,153,468 A | 11/2000 | Forbes et al. | 438/257 |
| 6,208,164 B1 * | 3/2001 | Noble et al. | 326/41 |
| 6,238,976 B1 | 5/2001 | Noble et al. | 438/259 |

OTHER PUBLICATIONS

Hergenrother, J.M., "The Vertical Replacement–Gate (VRG) MOSFET: A 50nm Vertical MOSFET with Lithography–Independent Gate Length", *IEEE*, pp. 75–78, (1999).
Kalavade, P., et al., "A Novel sub–10nm Transistor", *IEEE Device Research Conference*, Denver, Co., pp. 71–72, (2000).

Xuan, P., et al., "60nm Planarized Ultra–thin Body Solid Phase Epitaxy MOSFETs", *IEEE Device Research Conference*, Denver, CO, pp. 67–68, (2000).

* cited by examiner

*Primary Examiner*—Michael Tokar
*Assistant Examiner*—Anh Q. Tran
(74) *Attorney, Agent, or Firm*—Schwegman, Lundberg, Woessner & Kluth, P.A.

(57) ABSTRACT

Structures and methods for in-service programmable logic arrays with ultra thin vertical body transistors are provided. The in-service programmable logic array includes a first logic plane that receives a number of input signals. The first logic plane has a plurality of logic cells arranged in rows and columns that are interconnected to provide a number of logical outputs. A second logic plane has a number of logic cells arranged in rows and columns that receive the outputs of the first logic plane and that are interconnected to produce a number of logical outputs such that the in-service programmable logic array implements a logical function. Each of the logic cells includes a vertical pillar extending outwardly from a semiconductor substrate. Each pillar includes a single crystalline first contact layer and a second contact layer separated by an oxide layer. At least one single crystalline ultra thin vertical floating gate transistor that is disposed adjacent each vertical pillar. The single crystalline vertical floating gate transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A vertical floating gate opposes the ultra thin single crystalline vertical body region.

77 Claims, 18 Drawing Sheets

$V_G \longrightarrow V_G/k$   $V_0 \longrightarrow V_0/k$ $t_{ox} \longrightarrow t_{ox}/k$ $L \longrightarrow L/k$ $X_j \longrightarrow X_j/k$   JUNCTION DEPTH DECREASED $W_d \longrightarrow W_d/k$ $N_A \longrightarrow k\, N_A$   SUBSTRATE DOPING INCREASED

IN-SERVICE PROGRAMMABLE LOGIC ARRAYS WITH ULTRA THIN VERTICAL BODY TRANSISTORS

CROSS REFERENCE TO RELATED APPLICATIONS

This application is related to the following co-pending, commonly assigned U.S. patent applications: "Open Bit Line DRAM with Ultra Thin Body Transistors," Ser. No. 09/780,125, "Folded Bit Line DRAM with Ultra Thin Body Transistors," Ser. No. 09/780,130, "Programmable Logic Arrays with Ultra Thin Body Transistors," Ser. No. 09/780,087, "Memory Address and Decode Circuits with Ultra Thin Body Transistors," Ser. No. 09/780,144, "Programmable Memory Address and Decode Circuits with Ultra Thin Body Transistors," Ser. No. 09/780,126, and "Flash Memory with Ultra Thin Vertical Body Transistors," Ser. No. 09/780,169, which are filed on even date herewith and each of which disclosure is herein incorporated by reference.

FIELD OF THE INVENTION

The present invention relates generally to integrated circuits, and in particular to Flash memory with ultra thin vertical body transistors.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND-NAND, NOR-NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a programmable logic array. In order to keep up with the demands for larger programmable logic arrays, designers search for ways to reduce the size of the components of the array.

As the density requirements become higher and higher in logic and memories it becomes more and more crucial to minimize device area. The programmable logic array (PLA) circuit in the NOR-NOR configuration is one example of an architecture for implementing logic circuits.

Flash memory cells are one possible solution for high density memory requirements. Flash memories include a single transistor, and with high densities would have the capability of replacing hard disk drive data storage in computer systems. This would result in delicate mechanical systems being replaced by rugged, small and durable solid-state memory packages, and constitute a significant advantage in computer systems. What is required then is a flash memory with the highest possible density or smallest possible cell area.

The continuous scaling, however, poses problems even for flash memories since the single transistor in the flash memory has the same design rule limitations of conventional MOSFET technology. That is, the continuous scaling to the deep sub-micron region where channel lengths are less than 0.1 micron, 100 nm, or 1000 Å causes significant problems in the conventional transistor structures. As shown in FIG. 1, junction depths should be much less than the channel length of 1000 Å, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in MOSFET technology as it reduces the charge storage retention time on the capacitor cells. These extremely high doping levels result in increased leakage and reduced carrier mobility. Thus making the channel shorter to improve performance is negated by lower carrier mobility.

Therefore, there is a need in the art to provide improved in-service programmable logic arrays using sub-micron channel length transistors while avoiding the deleterious effects of short-channel effects such as drain-induced barrier lowering; threshold voltage roll off, and sub-threshold conduction, increased leakage and reduced carrier mobility.

SUMMARY OF THE INVENTION

The above mentioned problems with in service programmable logic arrays and other problems are addressed by the present invention and will be understood by reading and studying the following specification. Systems and methods are provided for in service programmable logic arrays using sub-micron channel length transistors with ultra thin bodies, or transistors where the surface space charge region scales down as other transistor dimensions scale down.

In one embodiment of the present invention, in service programmable logic arrays with ultra thin vertical body transistors are provided. The in-service programmable logic array includes a first logic plane that receives a number of input signals. The first logic plane has a plurality of logic cells arranged in rows and columns that are interconnected to provide a number of logical outputs. A second logic plane has a number of logic cells arranged in rows and columns that receive the outputs of the first logic plane and that are interconnected to produce a number of logical outputs such that the in service programmable logic array implements a logical function. Each of the logic cells includes a vertical pillar extending outwardly from a semiconductor substrate. Each pillar includes a single crystalline first contact layer and a second contact layer separated by an oxide layer. Each of the logic cells includes at least one single crystalline ultra thin vertical floating gate transistor that is disposed adjacent each vertical pillar. The single crystalline vertical floating gate transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A vertical floating gate opposes the ultra thin single crystalline vertical body region.

These and other embodiments, aspects, advantages, and features of the present invention will be set forth in part in the description which follows, and in part will become apparent to those skilled in the art by reference to the following description of the invention and referenced drawings or by practice of the invention, The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
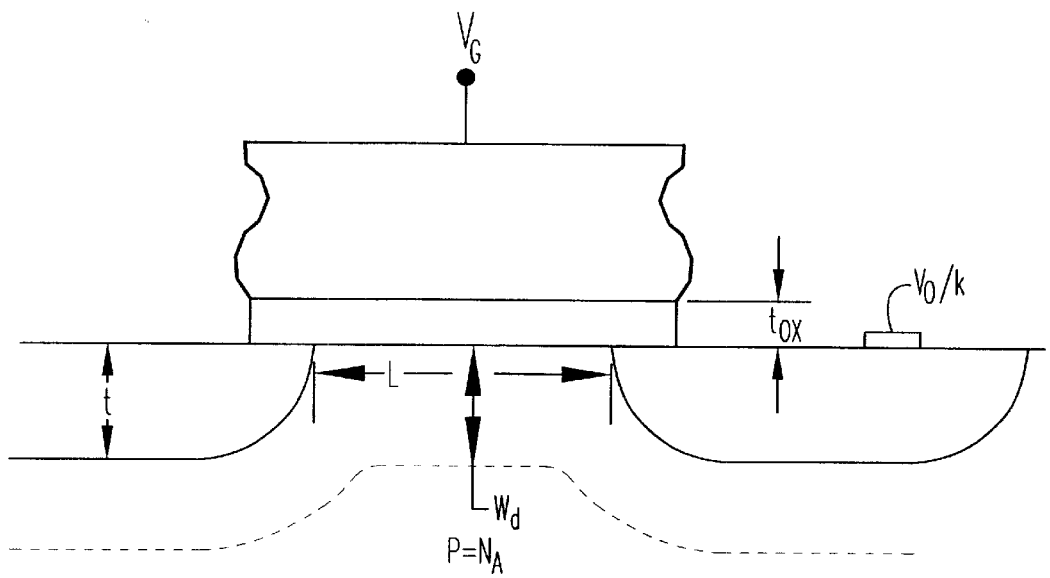
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 Å.
Figure 2:
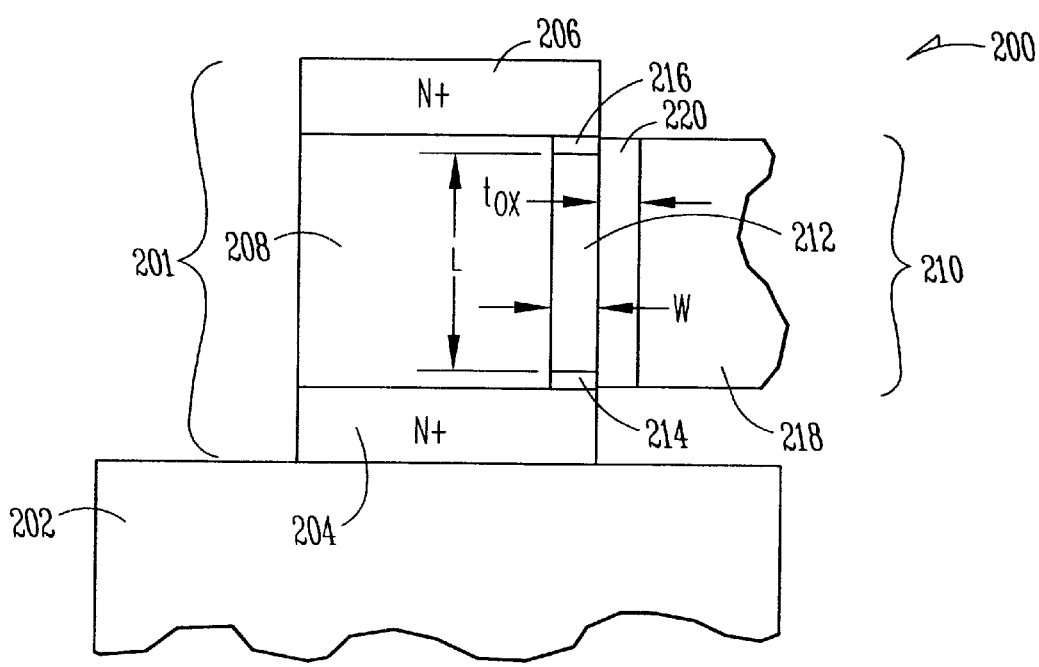
FIG. 2 is a diagram illustrating a vertical ultra thin body transistor formed along side of a pillar according to the teachings of the present invention.

FIG. 2 is a diagram illustrating an ultra thin single crystalline vertical transistor, or access FET 200 formed according to the teachings of the present invention. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. The an ultra thin single crystalline vertical first source/drain region 214 is coupled to the first contact layer 204 and the ultra thin single crystalline vertical second source/drain region 216 is coupled to the second contact layer. A gate 218 is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

As one of ordinary skill in the art will understand upon reading this disclosure, the ultra thin single crystalline vertical transistors with ultra thin bodies of the present invention provide a surface space charge region which scales down as other transistor dimensions scale down. This structure of the invention facilitates increasing density and design rule demands while suppressing short-channel effects such as drain-induced barrier lowering; threshold voltage roll off, and sub-threshold conduction.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
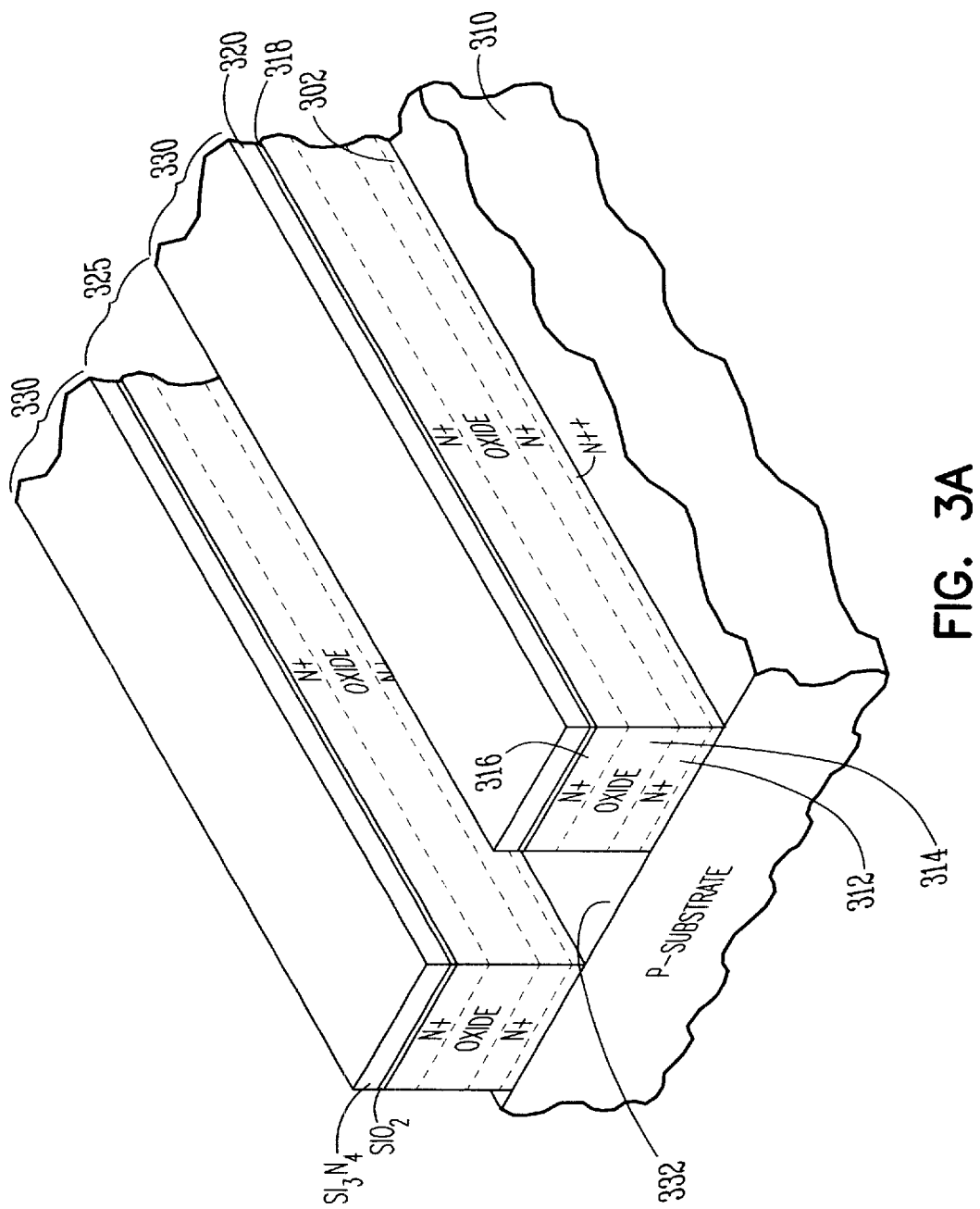
FIGS. 3A–3C illustrate an initial process sequence which for forming pillars along side of which vertical ultra thin body transistors can later be formed according to the teachings of the present invention.
Figure 3B:
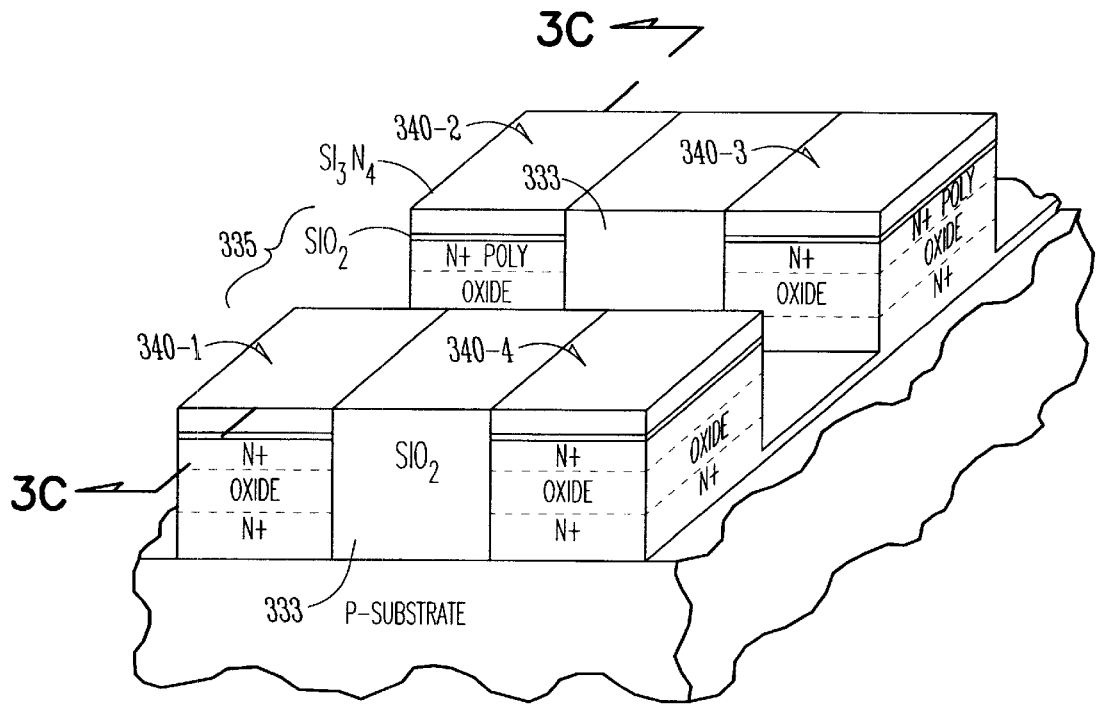
Figure 3C:
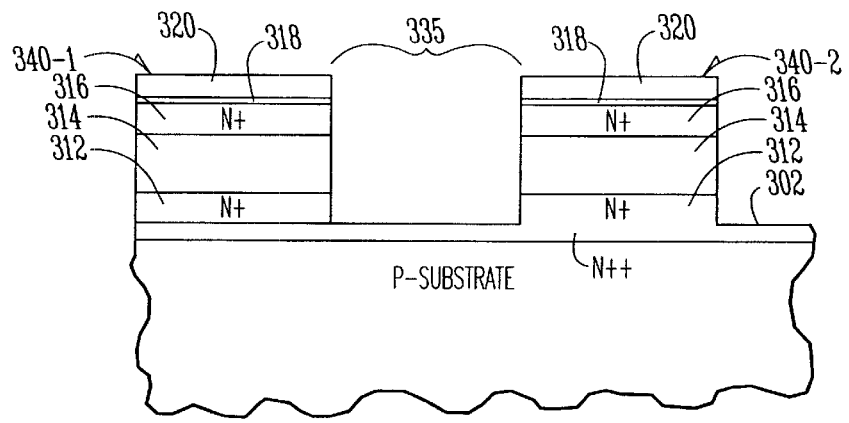

FIGS. 3A–3C illustrate an initial process sequence for forming pillars along side of which vertical ultra thin body transistors can later be formed as part of forming an in-service programmable logic array according to the teachings of the present invention. The dimensions suggested are appropriate to a 0.1 μm cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 μm. The overall thickness of the first contact layer 312 can be approximately between 0.2 to 0.5 μm. An oxide layer 314 of approximately 100 nanometers (nm), 0.1 μm, thickness or less is formed on the first contact layer 312. In one embodiment, the oxide layer 314 can be formed by thermal oxide growth techniques. A second contact layer 316 of n+ silicon is formed on the oxide layer 314, using known techniques to form a polycrystalline second contact layer 316. The second contact layer 316 is formed to a thickness of 100 nm or less.

Next, a thin silicon dioxide layer ($SiO_2$) 318 of approximately 10 nm is deposited on the second contact layer 316. A thicker silicon nitride layer ($Si_3N_4$) 320 of approximately 100 nm in thickness is deposited on the thin silicon dioxide layer ($SiO_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately one micron or less. The width of each trench 325 can be approximately equal to the line width of bars 330. The structure is now as appears in FIG. 3A.

In FIG. 3B, isolation material 333, such as $SiO_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed $SiO_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIGS. 3B having individually defined pillars 340-1, 340-2, 340-3, and 340-4.

FIG. 3C illustrates a cross sectional view of the structure shown in FIG. 3B taken along cut-line 3C—3C. FIG. 3C shows the continuous bit line 302 connecting adjacent pillars 340-1 and 340-2 in any given column. Trench 335 remains for the subsequent formation of floating gates and control gates, as described below, in between adjacent rows of the pillars, such as a row formed by pillars 340-1 and 340-4 and a row formed by pillars 340-2, and 340-3.

Figure 4A:
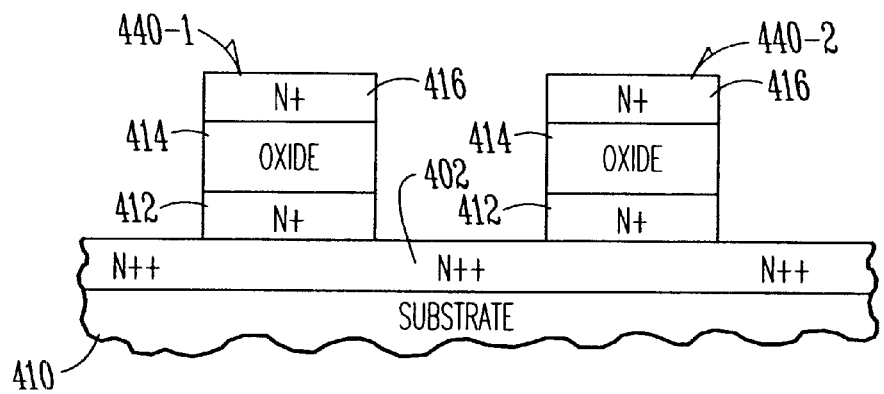
FIGS. 4A–4C illustrate that the above techniques described in connection with FIGS. 3A–3C can be implemented with a bulk CMOS technology or a silicon on insulator (SOI) technology.
Figure 4B:
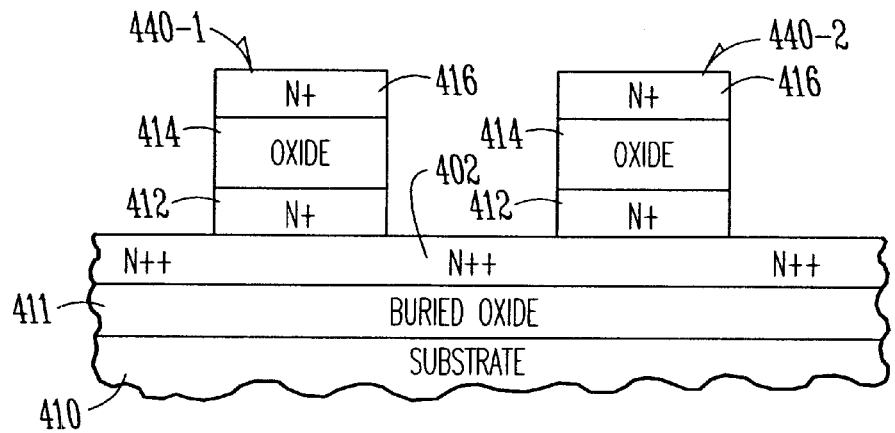
Figure 4C:
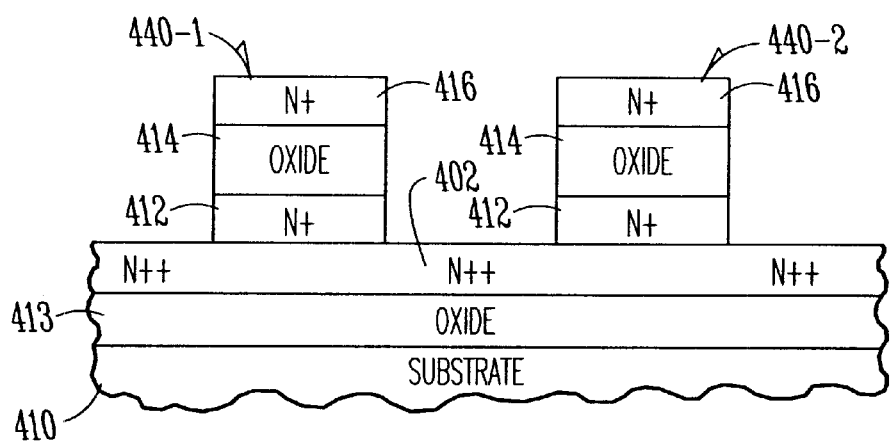

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continuous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown in FIGS. 4A–4C.

Figure 5A:
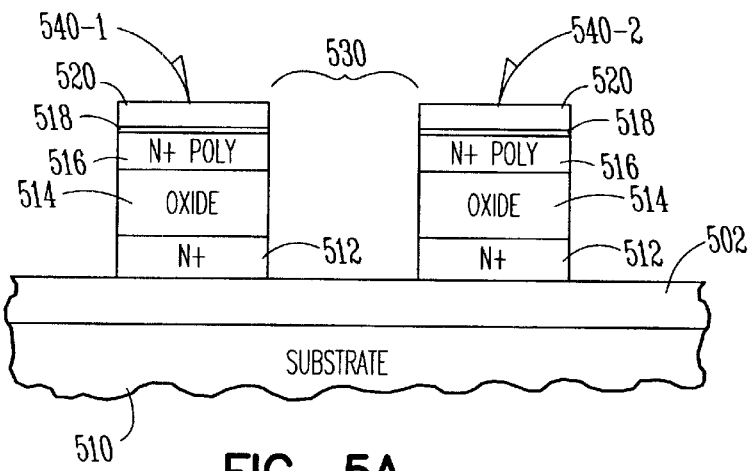
FIGS. 5A–5C illustrate a process sequence continuing from the pillar formation embodiments provided in FIGS. 3A–4C to form vertical ultra thin body transistors along side of the pillars.
Figure 5B:
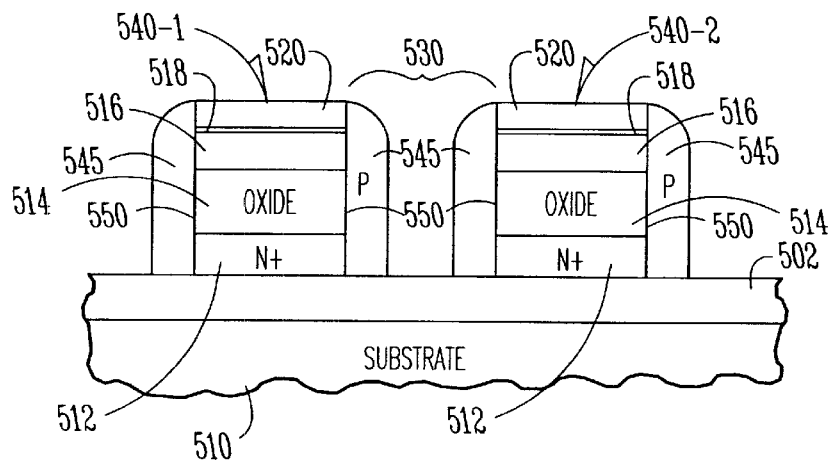
Figure 5C:
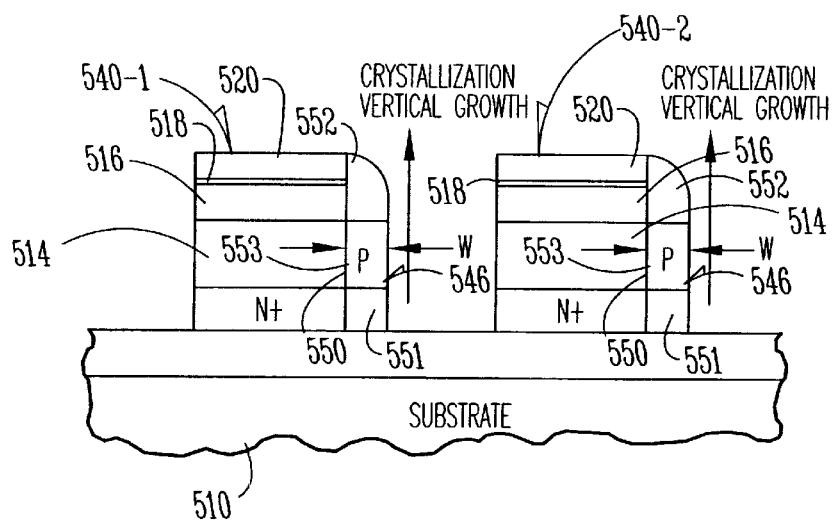

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 5A–5C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of ($SiO_2$) 518 and ($Si_3N_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 nm or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor.

In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2. This embodiment is shown in FIG. 5D.

As shown in FIGS. 5C and 5D, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 552 formed of the p-type material. In one embodiment of the present invention, the vertical single crystalline body region will have a vertical length of less than 100 nm. The structure is now as shown in FIGS. 5C or 5D. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
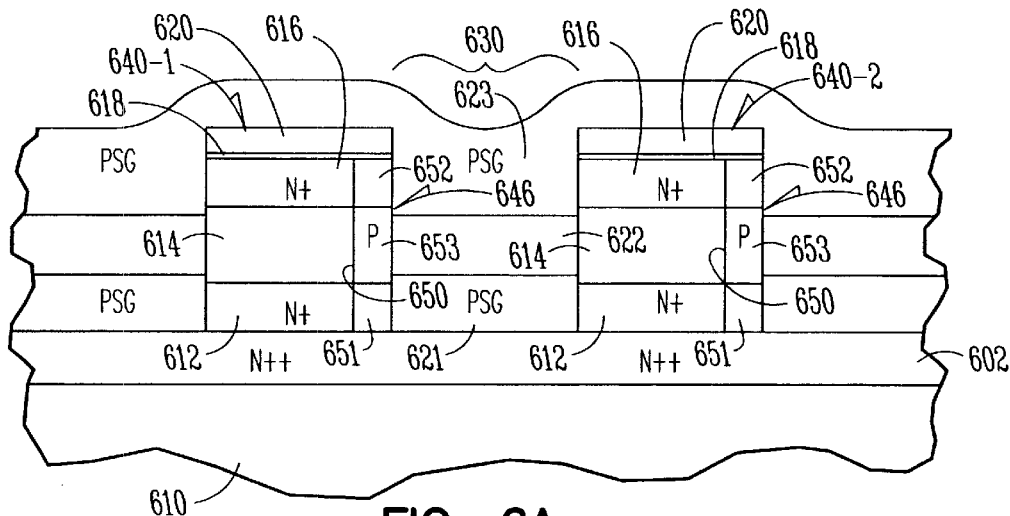
FIGS. 6A–6F illustrate a process sequence for forming a stacked horizontal floating gate and control gate structure embodiment according to the teachings of the present invention.

FIGS. 6A–6F illustrate a process sequence for forming a stacked horizontal floating gate and control gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

Figure 6B:
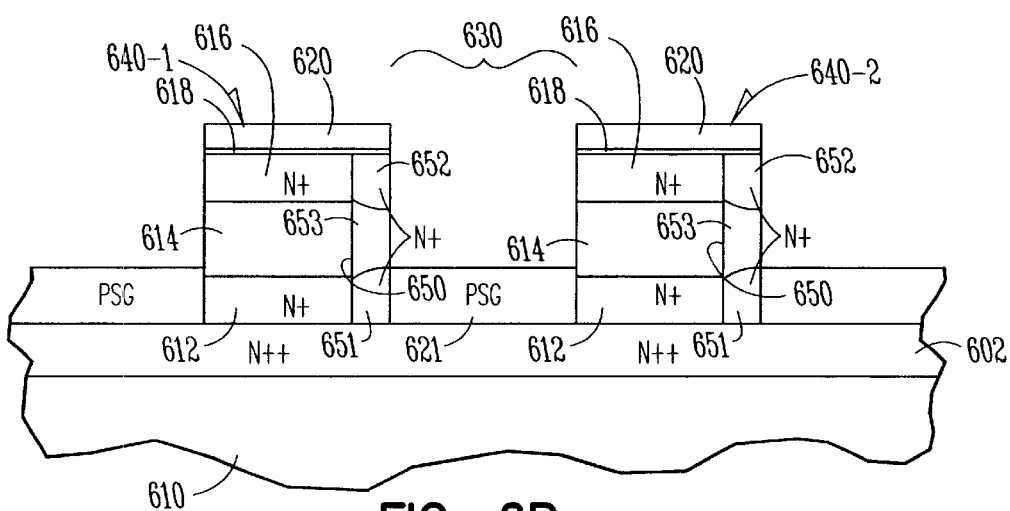

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Figure 6C:
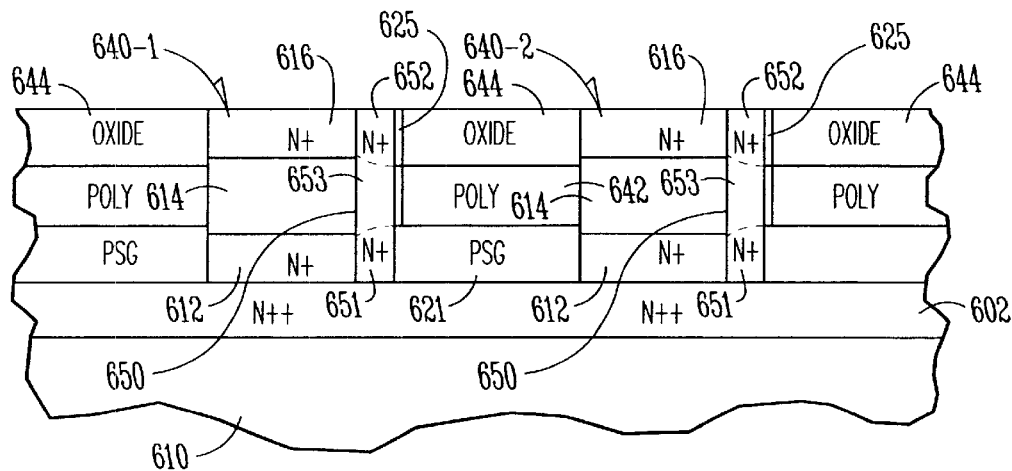

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653. Next, doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented floating gate 642 having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

Figure 6D:
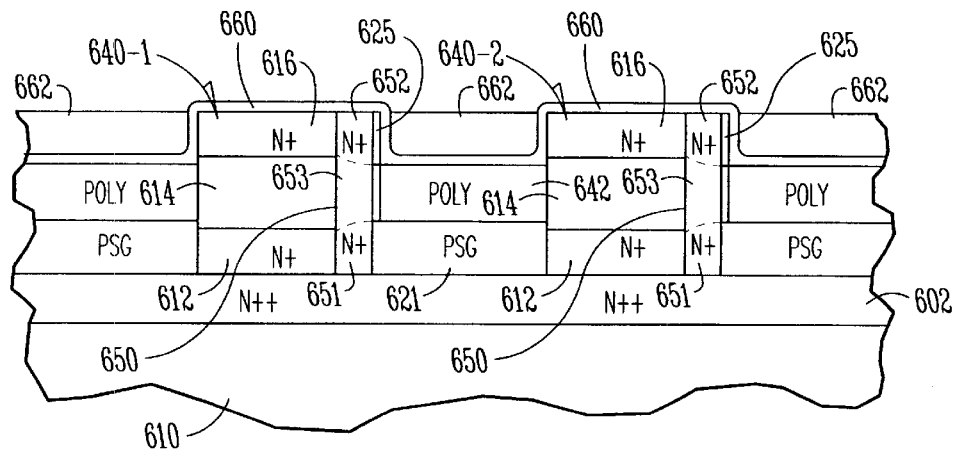

FIG. 6D illustrates the next sequence of fabrication steps. In FIG. 6D, the oxide layer 644 on the top of the horizontally oriented floating gate 642 is masked and etched, such as by RIE, to remove the oxide layer 644 in regions where the interpoly gate insulator or control gate insulator will be formed. Next, the interpoly gate insulator or control gate insulator 660 is formed. The interpoly gate insulator or control gate insulator 660 can be thermally grown oxide layer 660, or a deposited an oxynitride control gate insulator layer 660, as the same will be know and understood by one of ordinary skill in the art. The interpoly gate insulator or control gate insulator 660 is formed to a thickness of approximately 2 to 4 nanometers. Next, a polysilicon control gate 662 is formed. The polysilicon control gate can be formed by conventional photolithographic techniques for patterning and then depositing, such as by CVD, a polysilicon control gate line above the horizontally oriented floating gates 642. Another oxide layer can be deposited over the surface of the structure, such as by CVD to proceed with further fabrication steps.

Figure 6E:
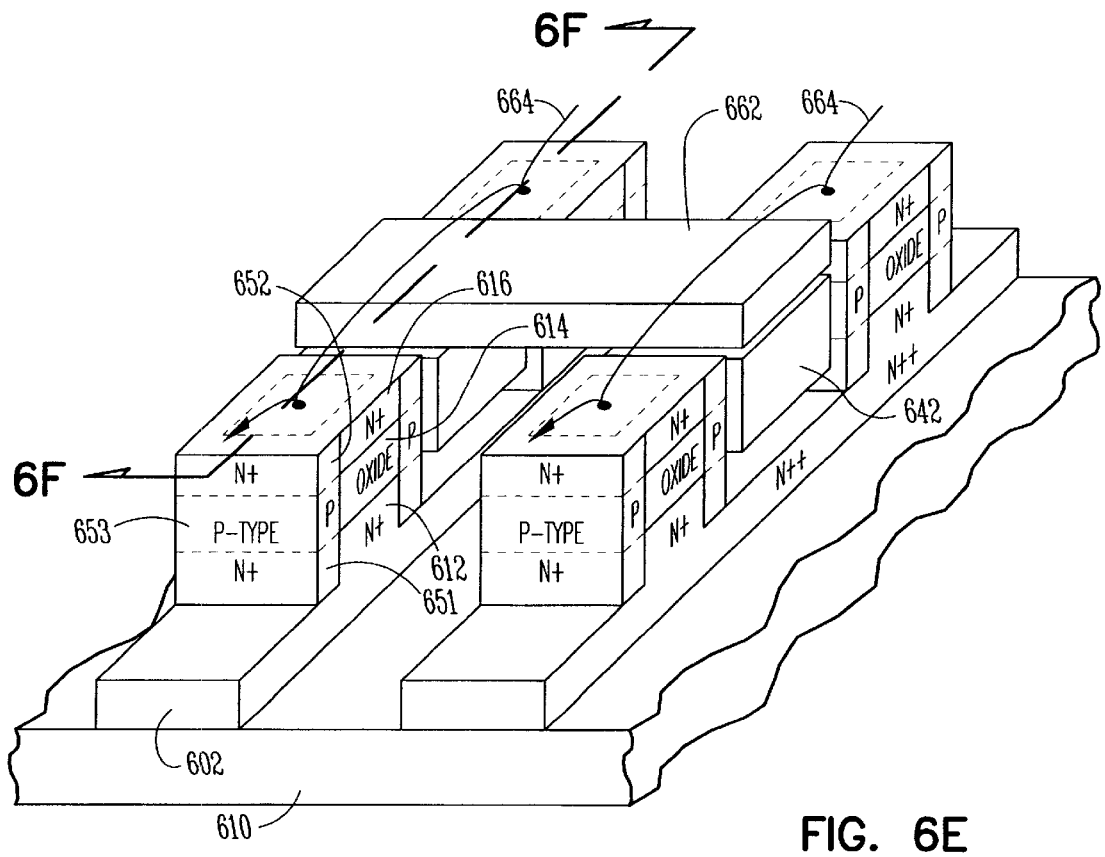

As one of ordinary skill in the art will understand upon reading this disclosure, contacts can be formed to the second contact layer 616 on top of the pillars 640-1 and 640-2 to continue with interconnect line 664 formation and standard BEOL processes. These methods can include conventional contact hole, terminal metal and inter level insulator steps to complete wiring of the cells and peripheral circuits. FIG. 6E is a perspective view of the completed structure.

Figure 6F:
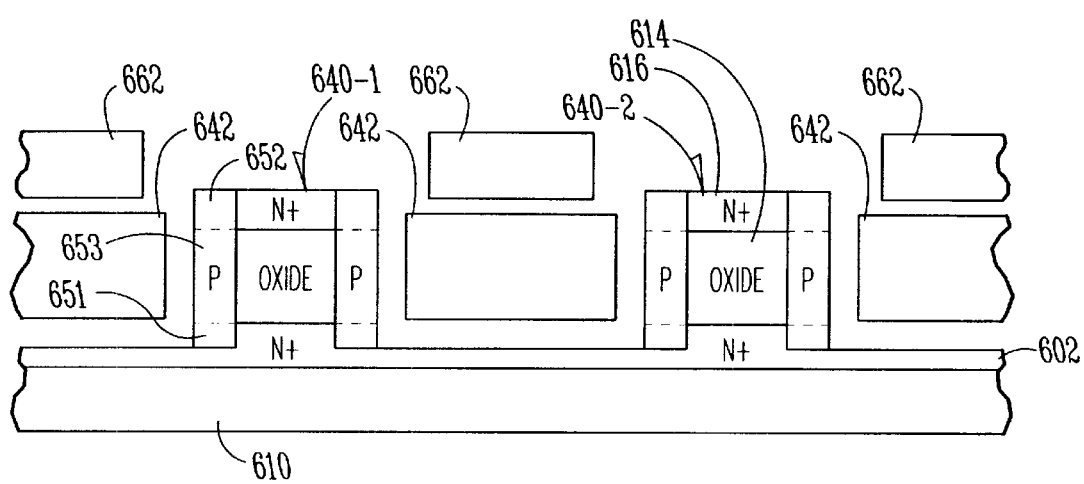

And, FIG. 6F is a cross sectional view of the same taken along cut line 6F—6F.

Alternatively, the above sequence of fabrication could have been followed minus the replacement gate steps. In this alternative embodiment, the process would have again begun with a structure similar to that shown in FIG. 5C. However, in FIG. 6A a conformal nitride layer would have been deposited to approximately 10 nm and then directionally etched to leave the nitride on the sidewalls of the pillars. A thermal oxide would be grown to insulate the exposed segments of the sourcelines 602, or y-address line bars 602. The nitride would then be stripped by an isotropic etch (e.g. phosphoric acid) and a thin tunneling, floating gate oxide of approximately 1 to 2 nm would be grown on the wall of the exposed ultrathin single crystalline film 646. An n-type polysilicon layer would be deposited to fill the trenches (e.g ) 100 nm) and planarized (e.g. by CMP) and then recessed slightly below the level of the top of the ultrathin single crystalline film 646. The process would then simply continue with an etch process as described above to strip the nitride layer 620 from the structure. This can include a phosphoric etch process using phosphoric acid. From FIG. 6C forward the process would continue as described above to complete the structure.

Figure 7A:
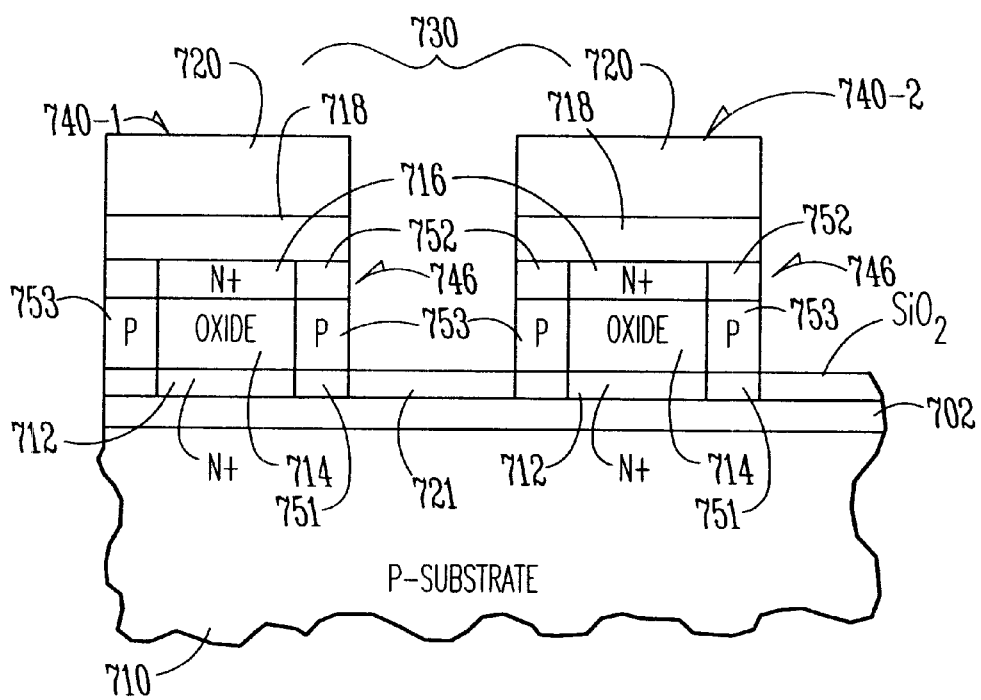
FIGS. 7A–7F illustrate a process description of one embodiment by which vertical floating gates and vertical control gates can be formed alongside vertical ultra-thin transistor body structures according to the teachings of the present invention.

FIGS. 7A–7E illustrate a process description of one embodiment by which vertical floating gates and vertical control gates can be formed alongside vertical ultra-thin transistor body structures. These structures can be achieved by someone skilled in the art of integrated circuit fabrication upon reading this disclosure. The dimensions suggested in the following process steps are appropriate to a 0.1 μm CD technology and may be scaled accordingly for other CD sizes. FIG. 7A represents a structure similar to that shown in FIG. 5C. That is FIG. 7A shows an ultrathin single crystalline film 746 along the sidewalls of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 10 nm is deposited, such as by CVD, and directionally etched to leave only on the sidewalls of the pillars 740-1 and 740-2. A oxide layer 721 is then grown, such as by thermal oxidation, to a thickness of approximately 20 nm in order to insulate the exposed bit line bars 702. The conformal nitride layer on the sidewalls of the pillars 740-1 and 740-2 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
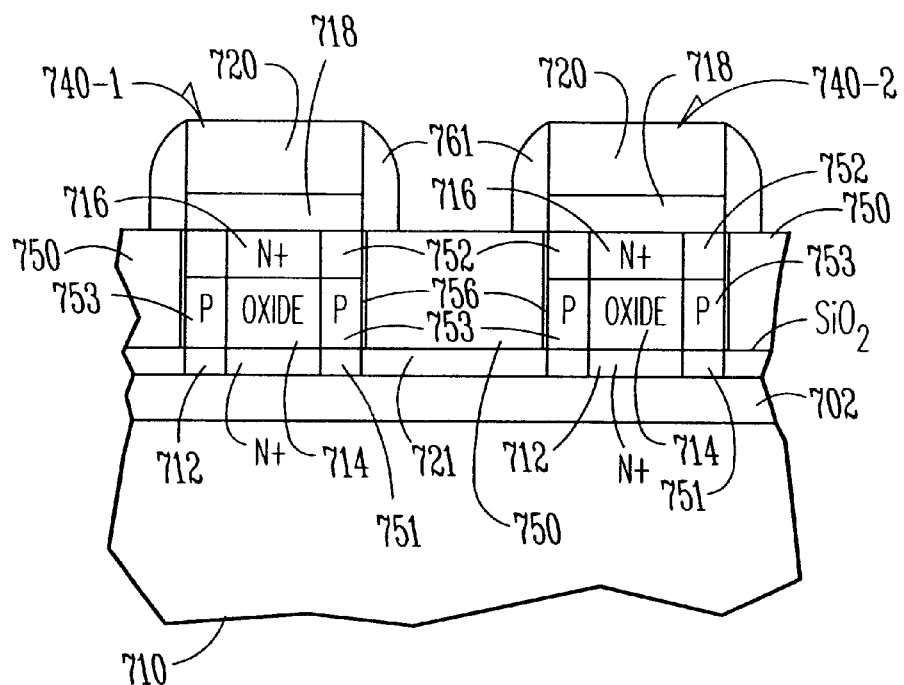

As shown in FIG. 7B, a thin tunneling oxide 756 is thermally grown on the sidewalls of the exposed ultrathin single crystalline film 746. The thin tunneling oxide 756 is grown to a thickness of approximately 1 to 2 nm. An n+ doped polysilicon material or suitable metal 750 is deposited, such as by CVD, to fill the trenches to a thickness of approximately 40 nm or less. The n+ doped polysilicon material 750 is then planarized, such as by CMP, and recessed, such as by RIE, to a height slightly below a top level of the ultrathin single crystalline film 746. A nitride layer 761 is then deposited, such as by CVD, to a thickness of approximately 20 nm for spacer formation and directionally etched to leave on the sidewalls of the thick oxide and nitride pad layers, 718 and 720 respectively. The structure is now as shown in FIG. 7B.

Figure 7C:
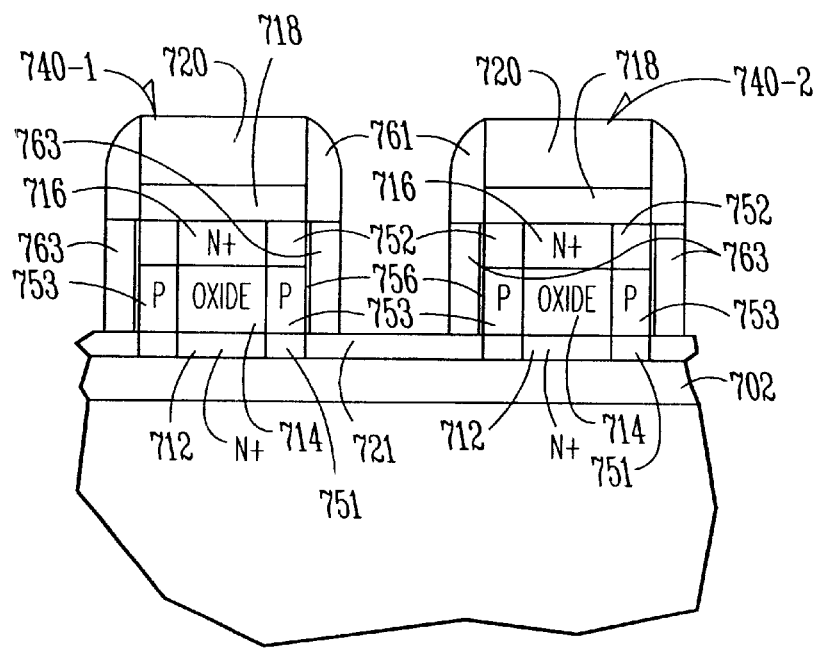

FIG. 7C illustrates the structure following the next sequence of processing steps. In FIG. 7C, the nitride spacers 761 are used as a mask and the exposed oxide in between columns of pillars, e.g. oxide 333 in FIG. 3B, is selectively etched between the sourcelines 702 to a depth approximately level with the oxide 721 on the sourcelines/y-address lines 702. Next, again using the nitride spacers 761 as a mask, the exposed n+ doped polysilicon material 750 is selectively etched stopping on the oxide layer 721 on the sourcelines/y-address lines 702 thus creating a pair of vertically oriented floating gates 763 in trench 730. The structure is now as appears in FIG. 7C.

Figure 7D:
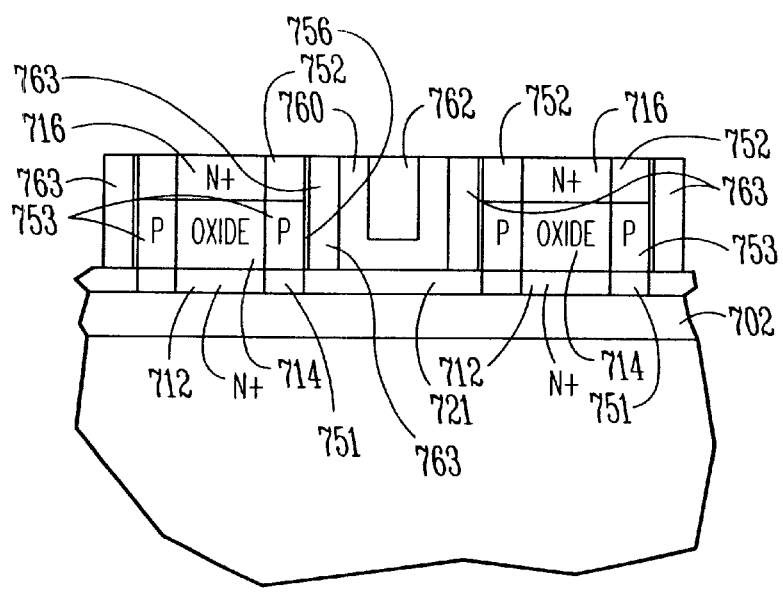

FIG. 7D illustrates the next sequence in this embodiment of the fabrication process. In FIG. 7D, the interpoly gate insulator or control gate insulator 760 is formed in the trench 730 covering the vertically oriented floating gates 763. The interpoly gate insulator or control gate insulator 760 can be thermally grown oxide layer 760, or a deposited an oxynitride control gate insulator layer 760, as the same will be know and understood by one of ordinary skill in the art. The interpoly gate insulator or control gate insulator 760 is formed to a thickness of approximately 7 to 15 nanometers. An n+ doped polysilicon material or suitable gate material 762 is deposited, such as by CVD, to fill the trenches, or gate through troughs 730 to a thickness of approximately 100 nm. The n+ doped polysilicon material 762 is then planarized, such as by CMP, stopping on the thick nitride pad layer 720. The n+ doped polysilicon material 762 is then recessed, such as by RIE, to the approximately a top level of the ultrathin single crystalline film 746. Next, the nitride pad layer 720 is removed from the pillars 740-1 and 740-2. The nitride pad layer can be removed using a phosphoric etch or other suitable techniques. An oxide 775 is then deposited over the structure, such as by CVD, to cover the surface. The structure is now as appears in FIG. 7D.

Figure 7E:
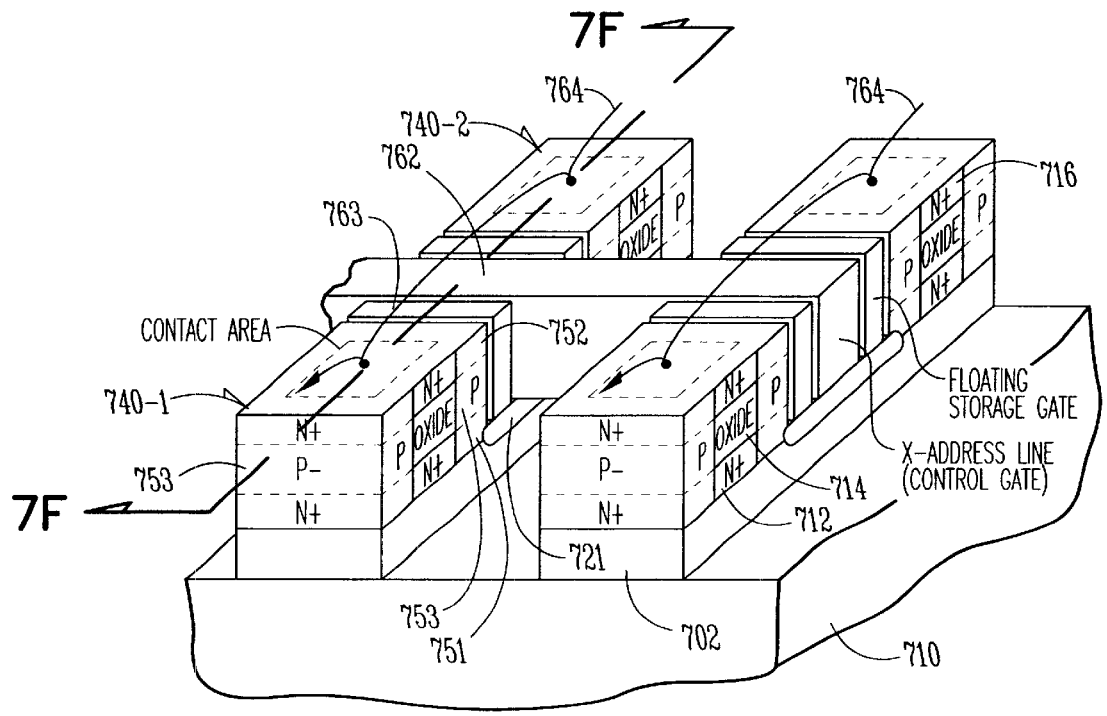
Figure 7F:
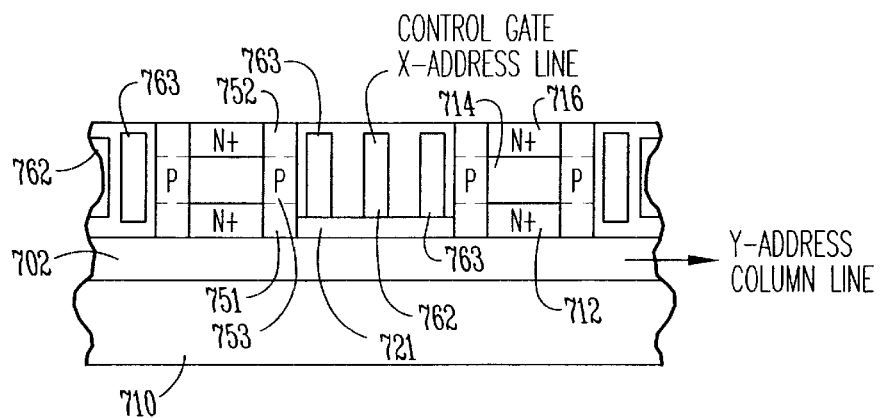

As one of ordinary skill in the art will understand upon reading this disclosure, contacts can be formed to the second contact layer 716 on top of the pillars 740-1 and 740-2 to continue with interconnect line 764 formation and standard BEOL processes. These methods can include conventional contact hole, terminal metal and inter level insulator steps to complete wiring of the cells and peripheral circuits. FIG. 7E is a perspective view of the completed structure. And, FIG. 7F is a cross sectional view of the same taken along cut line 7F—7F.

Figure 8A:
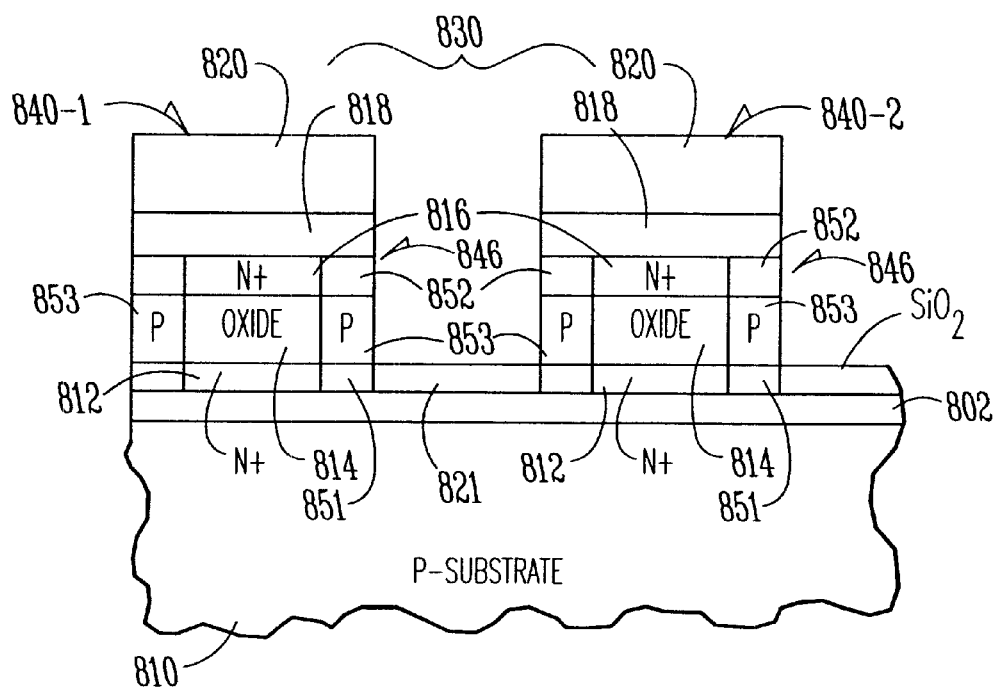
FIGS. 8A–8E illustrate a process description of one embodiment by which vertical floating gates can be formed alongside vertical ultra-thin transistor body structures and a horizontal oriented control gate can be formed above the vertically oriented floating gates according to the teachings of the present invention.

FIGS. 8A–8E illustrate a process description of one embodiment by which vertical floating gates can be formed alongside vertical ultra-thin transistor body structures and a horizontal oriented control gate can be formed above the vertically oriented floating gates. These structures can be achieved by someone skilled in the art of integrated circuit fabrication upon reading this disclosure. The dimensions suggested in the following process steps are appropriate to a 0.1 μm CD technology and may be scaled accordingly for other CD sizes. FIG. 8A represents a structure similar to that shown in FIG. 5C. That is FIG. 8A shows an ultrathin single crystalline film 846 along the sidewalls of pillars 840-1 and 840-2 in trenches 830. The ultrathin single crystalline film 846 at this point includes an ultra thin single crystalline vertical first source/drain region 851 coupled to a first contact layer 812 and an ultra thin single crystalline vertical second source/drain region 852 coupled to a second contact layer 816. An ultra thin p-type single crystalline vertical body region 853 is present along side of, or opposite, an oxide layer 814 and couples the first source/drain region 851 to the second source/drain region 852. According to the process embodiment shown in FIG. 8A, a conformal nitride layer of approximately 10 nm is deposited, such as by CVD, and directionally etched to leave only on the sidewalls of the pillars 840-1 and 840-2. A oxide layer 821 is then grown, such as by thermal oxidation, to a thickness of approximately 20 nm in order to insulate the exposed bit line bars 802. The conformal nitride layer on the sidewalls of the pillars 840-1 and 840-2 prevents oxidation along the ultrathin single crystalline film 846. The nitride layer is then stripped, using conventional stripping processes as the same will be known and understood by one of ordinary skill in the art. The structure is now as appears in FIG. 8A.

Figure 8B:
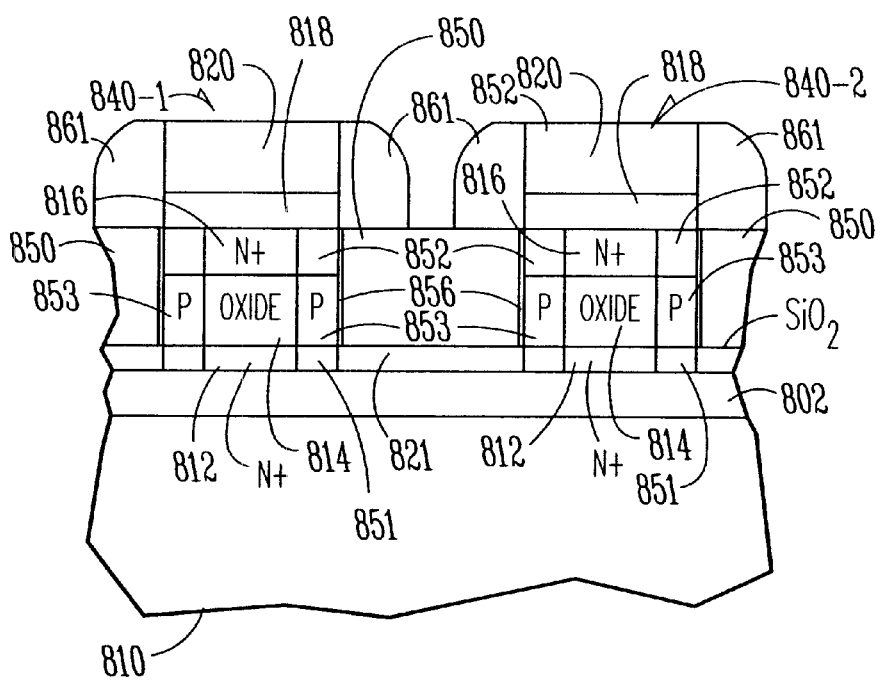

As shown in FIG. 8B, a thin tunneling oxide 856 is thermally grown on the sidewalls of the exposed ultrathin single crystalline film 846. The thin tunneling oxide 856 is grown to a thickness of approximately 1 to 2 nm. An n+ doped polysilicon material or suitable metal 850 is deposited, such as by CVD, to fill the trench to a thickness of approximately 40 nm or less. The n+ doped polysilicon material 850 is then planarized, such as by CMP, and recessed, such as by RIE, to a height slightly below a top level of the ultrathin single crystalline film 846. A nitride layer 861 is then deposited, such as by CVD, to a thickness of approximately 50 nm for spacer formation and directionally etched to leave on the sidewalls of the thick oxide and nitride pad layers, 818 and 820 respectively. The structure is now as shown in FIG. 8B.

Figure 8C:
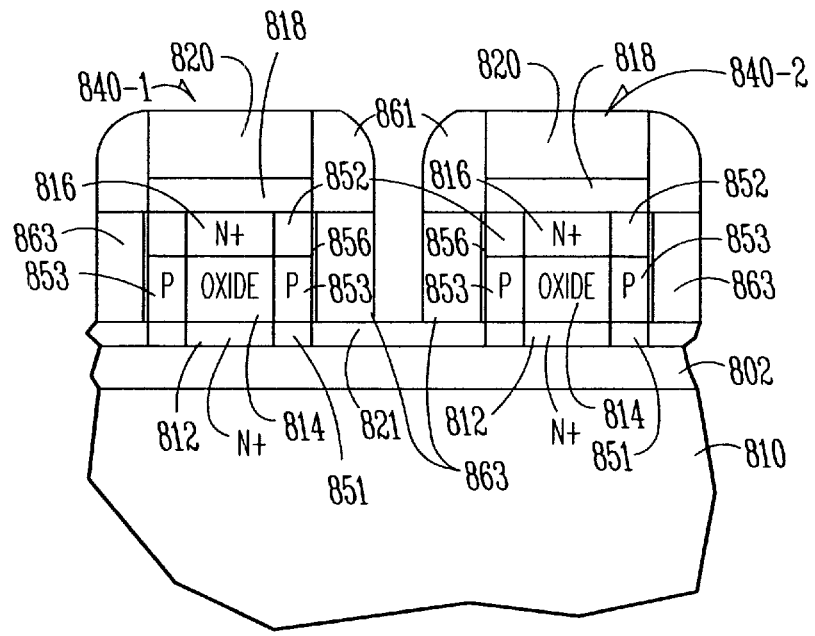

FIG. 8C illustrates the structure following the next sequence of processing steps. In FIG. 8C, the nitride spacers 861 are used as a mask and the exposed oxide in between columns of pillars, e.g. oxide 333 in FIG. 3B, is selectively etched between the sourcelines 802 to a depth approximately level with the oxide 821 on the sourcelines/y-address lines 802. Next, again using the nitride spacers 861 as a mask, the exposed n+ doped polysilicon material 850 is selectively etched stopping on the oxide layer 821 on the sourcelines/y-address lines 802 thus creating a pair of vertically oriented floating gates 863 in trench 830. The structure is now as appears in FIG. 8C.

Figure 8D:
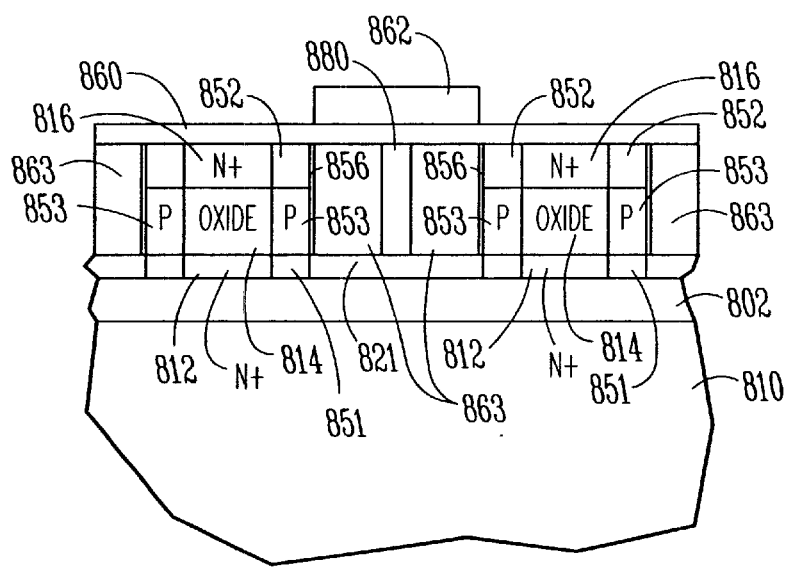

FIG. 8D illustrates the next sequence in this embodiment of the fabrication process. In FIG. 8D, an oxide layer 880 is deposited in the trench 830 covering the vertically oriented floating gates 863. The oxide layer 880 is planarized, such as by CMP, stopping on the thick nitride pad layer 820. The oxide layer 880 is then recessed, such as by RIE, to the approximately a top level of the ultrathin single crystalline film 846. Next, the nitride pad layer 820 is removed from the pillars 840-1 and 840-2 and the nitride spacers 861 are also removed. The nitride pad layer 820 and nitride spacers 861 can be removed using a phosphoric etch or other suitable techniques. An interpoly gate insulator or control gate insulator 860 is formed over the oxide layer 880 in the trench 830 and over the vertically oriented floating gates 863. The interpoly gate insulator or control gate insulator 860 can be a thermally grown oxide layer 860, or a deposited an oxynitride control gate insulator layer 860, as the same will be know and understood by one of ordinary skill in the art. The interpoly gate insulator or control gate insulator 860 is formed to a thickness of approximately 2 to 4 nanometers on the vertically oriented floating gates 863. An n+ doped polysilicon material or suitable gate material 862 is deposited, such as by CVD, over the interpoly gate insulator or control gate insulator 860 and above the vertically oriented floating gates 863 to a thickness of approximately 50 nm. The n+ doped polysilicon material 862 is then patterned, as the same will be know and understood by one of ordinary skill in the art, into horizontal bars or control gate lines. An oxide 875 is can then deposited, such as by CVD to cover the surface. The structure is now as appears in FIG. 8D.

Figure 8E:
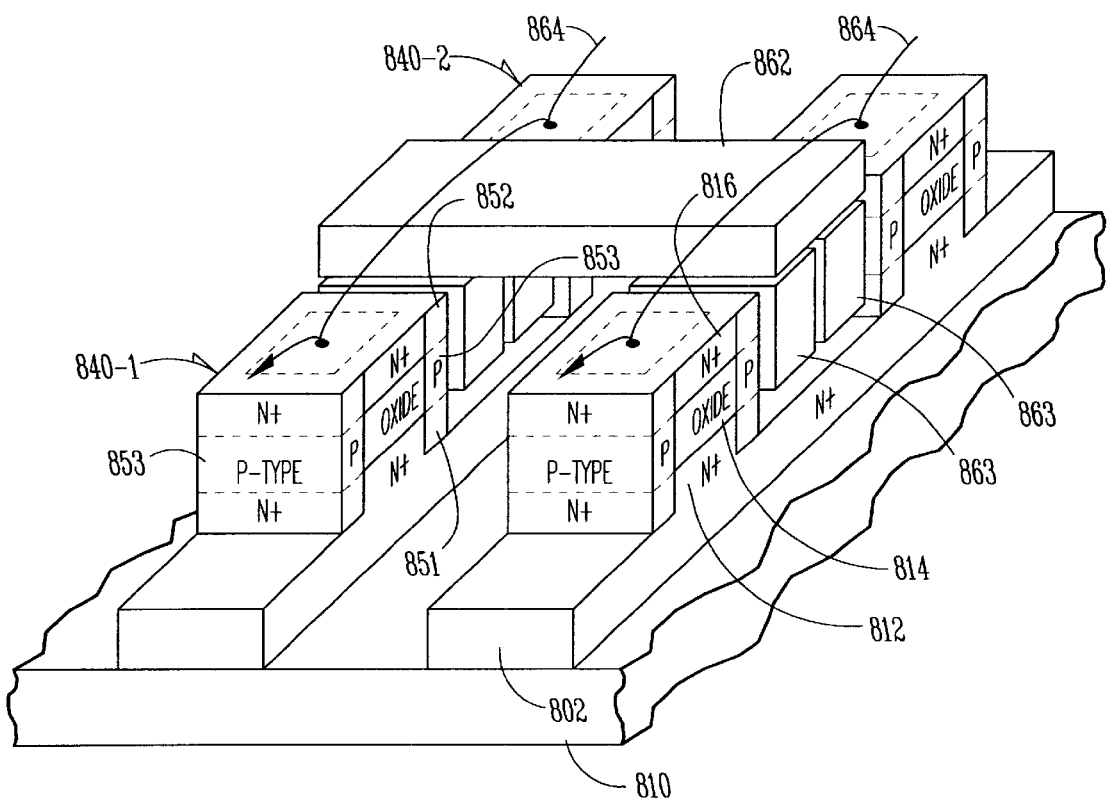

As one of ordinary skill in the art will understand upon reading this disclosure, contacts can be formed to the second contact layer 816 on top of the pillars 840-1 and 840-2 to continue with interconnect line 864 formation and standard BEOL processes. These methods can include conventional contact hole, terminal metal and inter level insulator steps to complete wiring of the cells and peripheral circuits. FIG. 8E is a perspective view of the completed structure.

Figure 9:
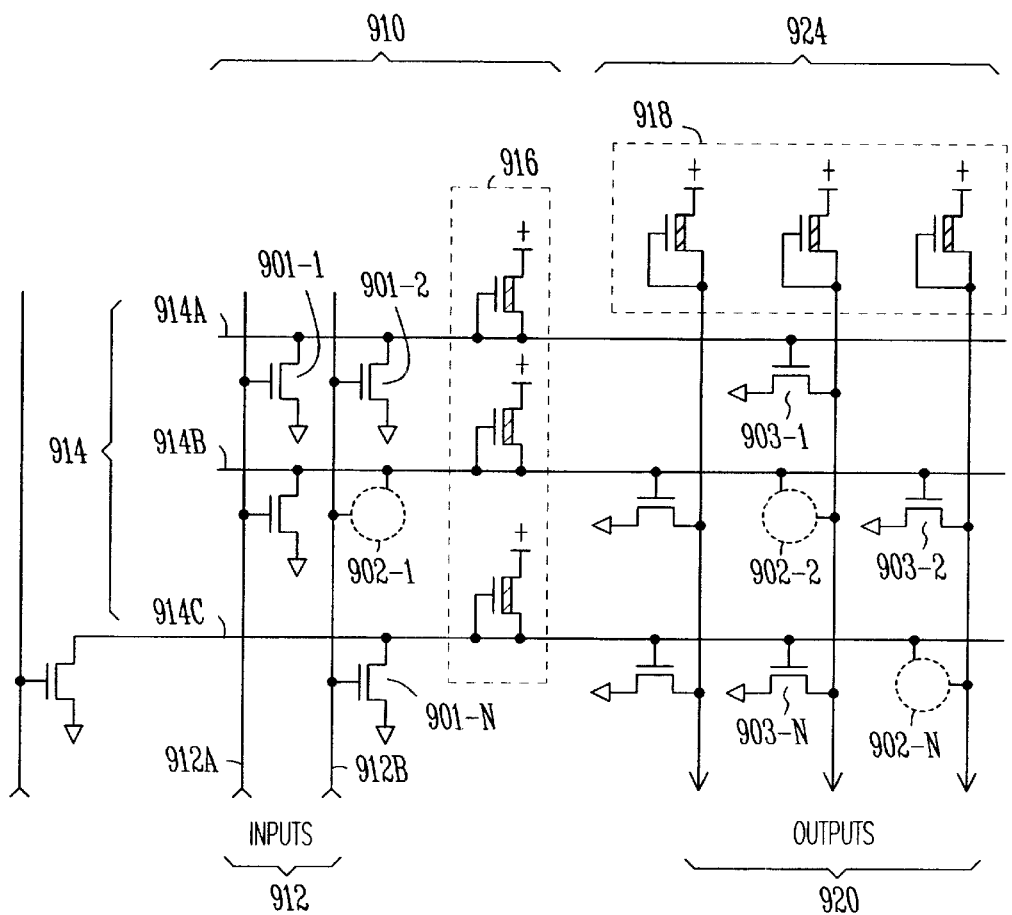
FIG. 9 is a schematic diagram illustrating a conventional NOR-NOR programmable logic array.

FIG. 9 shows a conventional NOR-NOR logic array 900 which is programmable at the gate mask level by either fabricating a thin oxide gate transistor, e.g. logic cells 901-1, 901-2, . . . , 901-N and 903-1, 903-2, . . . , 903-N, at the intersection of lines in the array or not fabricating a thin oxide gate transistor, e.g. missing thin oxide transistors, 902-1, 902-2, . . . , 902-N, at such an intersection. As one of ordinary skill in the art will understand upon reading this disclosure, the same technique is conventionally used to form other types of logic arrays not shown. As shown in FIG. 9, a number of depletion mode NMOS transistors, 916 and 918 respectively, are used as load devices.

The conventional logic array shown in FIG. 9 includes a first logic plane 910 which receives a number of input signals at input lines 912. In this example, no inverters are provided for generating complements of the input signals. However, first logic plane 910 can include inverters to produce the complementary signals when needed in a specific application.

First logic plane 910 includes a number of thin oxide gate transistors, e.g. transistors 901-1, 901-2, . . . , 901-N. The thin oxide gate transistors, 901-1, 901-2, . . . , 901-N, are located at the intersection of input lines 912, and interconnect lines 914. In the conventional PLA of FIG. 9, this selective fabrication of thin oxide gate transistor, e.g. transistors 901-1, 901-2, . . . , 901-N, is referred to as programming since the logical function implemented by the programmable logic array is entered into the array by the selective arrangement of the thin oxide gate transistors, or logic cells, 901-1, 901-2, . . . , 901-N, at the intersections of input lines 912, and interconnect lines 914 in the array.

In this embodiment, each of the interconnect lines 914 acts as a NOR gate for the input lines 912 that are connected to the interconnect lines 914 through the thin oxide gate transistors, 901-1, 901-2, . . . , 901-N, of the array. For example, interconnection line 914A acts as a NOR gate for the signals on input lines 912A and 912B. That is, interconnect line 914A is maintained at a high potential unless one or more of the thin oxide gate transistors, 901-1, 901-2, . . . , 901-N, that are coupled to interconnect line 914A are turned on by a high logic level signal on one of the input lines 912. When a control gate address is activated, through input lines 912, each thin oxide gate transistor, e.g. transistors 901-1, 901-2, . . . , 901-N, conducts which performs the NOR positive logic circuit function, an inversion of the OR circuit function results from inversion of data onto the interconnect lines 914 through the thin oxide gate transistors, 901-1, 901-2, . . . , 901-N, of the array.

As shown in FIG. 9, a second logic plane 924 is provided which includes a number of thin oxide gate transistor, e.g. transistors 903-1, 903-2, . . . , 903-N. The thin oxide gate transistors, 903-1, 903-2, . . . , 903-N, are located at the intersection of interconnect lines 914, and output lines 920. Here again, the logical function of the second logic plane 924 is implemented by the selective arrangement of the thin oxide gate transistors, 903-1, 903-2, . . . , 903-N, at the intersections of interconnect lines 914, and output lines 920 in the second logic plane 924. The second logic plane 924 is also configured such that the output lines 920 comprise a logical NOR function of the signals from the interconnection lines 914 that are coupled to particular output lines 920 through the thin oxide gate transistors, 903-1, 903-2, . . . , 903-N, of the second logic plane 924. Thus, in FIG. 9, the incoming signals on each line are used to drive the gates of transistors in the NOR logic array as the same is known by one of ordinary skill in the art and will be understood by reading this disclosure.

Figure 10:
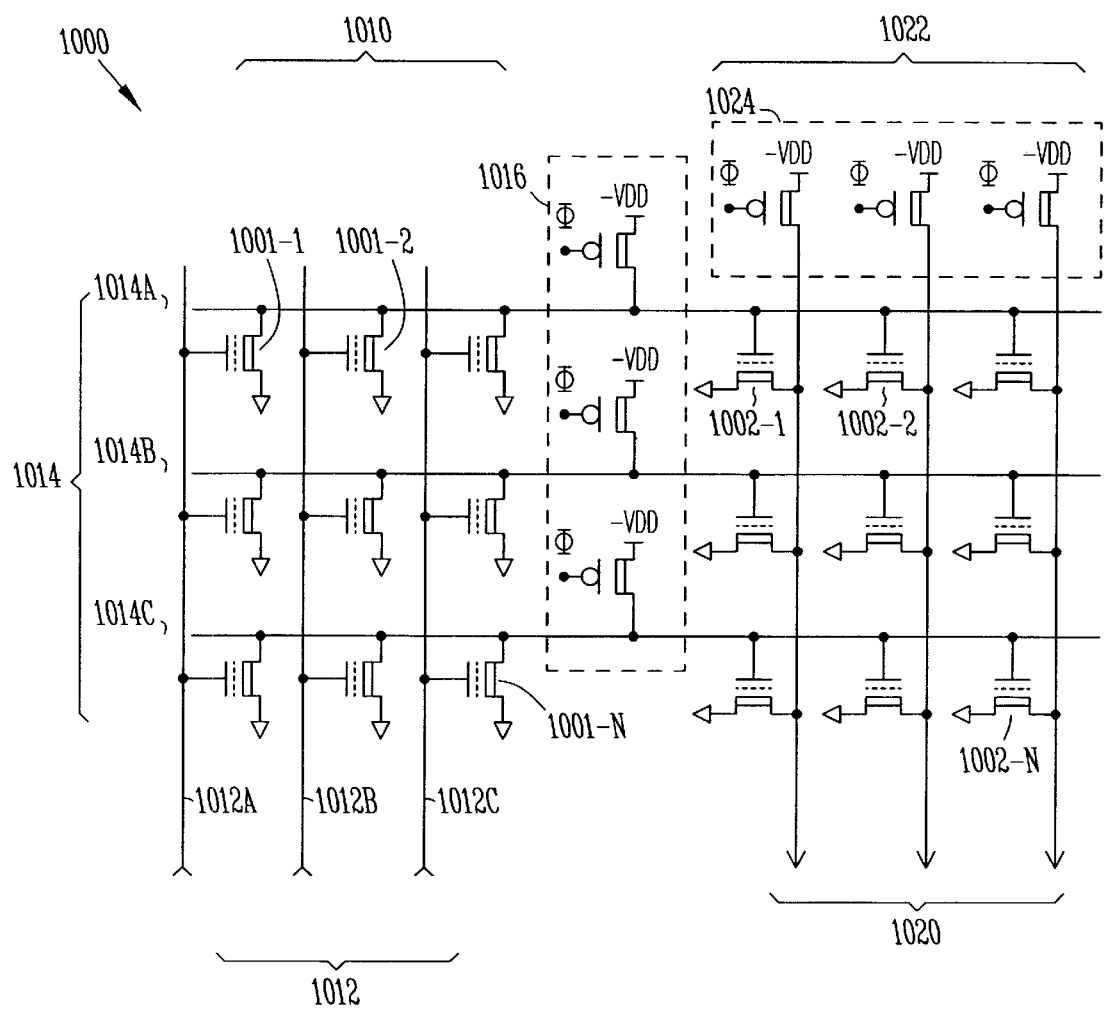
FIG. 10 is a schematic diagram illustrating generally an architecture of one embodiment of a novel in-service programmable logic array (PLA) with floating gate transistors, or logic cells, according to the teachings of the present invention.

FIG. 10 illustrates an embodiment of a novel in-service programmable logic array (PLA) formed according to the teachings of the present invention. In FIG. 10, PLA 1000 implements an illustrative logical function using a two level logic approach. Specifically, PLA 1000 includes first and second logic planes 1010 and 1022. In this example, the logic function is implemented using NOR-NOR logic. As shown in FIG. 10, first and second logic planes 1010 and 1022 each include an array of, logic cells, or floating gate driver transistors, 1001-1, 1001-2, . . . , 1001-N, and 1002-1, 1002-2, . . . , 1002-N respectively, having their first source/drain regions coupled to source lines or a conductive source plane, as shown and described in more detail in connection with FIGS. 3A and 8E. These floating gate driver transistors, 1001-1, 1001-2, . . . , 1001-N, and 1002-1, 1002-2, . . . , 1002N are configured to implement the logical function of FPLA 1000. The floating gate driver transistors, 1001-1, 1001-2, . . . , 1001-N, and 1002-1, 1002-2,. . . , 1002N are shown as n-channel floating gate transistors. Also, as shown in FIG. 10, a number of p-channel metal oxide semiconductor (PMOS) transistors are provided as load device transistors, 1016 and 1024 respectively, having their drain regions coupled to a voltage potential (VDD). These load device transistors, 1016 and 1024 respectively, operate in complement to the floating gate driver transistors, 1001-1, 1001-2,. . . , 1001-N, and 1002-1, 1002-2, . . . , 1002-N to form load inverters.

It is noted that the configuration of FIG. 10 is provided by way of example and not by way of limitation. Specifically, the teachings of the present application are not limited to programmable logic arrays in the NOR-NOR approach. Further, the teachings of the present application are not limited to the specific logical function shown in FIG. 10. Other logical functions can be implemented in a programmable logic array, with the floating gate driver transistors, 1001-1, 1001-2, . . . , 1001-N, and 1002-1, 1002-2, . . . , 1002-N and load device transistors, 1016 and 1024 respectively, of the present invention, using any one of the various two level logic approaches.

First logic plane 1010 receives a number of input signals at input lines 1012. In this example, no inverters are provided for generating complements of the input signals. However, first logic plane 1010 can include inverters to produce the complementary signals when needed in a specific application.

First logic plane 1010 includes a number of floating gate driver transistors, 1001-1, 1001-2, . . . , 1001-N, that form an array. The floating gate driver transistors, 1001-1, 1001-2, . . . , 1001-N, are located at the intersection of input lines 1012, and interconnect lines 1014. Not all of the floating gate driver transistors, 1001-1, 1001-2,. . . , 1001-N, are operatively conductive in the first logic plane. Rather, the floating gate driver transistors, 1001 -1, 1001-2, . . . , 1001-N, are selectively programmed, as described in detail below, to respond to the input lines 1012 and change the potential of the interconnect lines 1014 so as to implement a desired logic function. This selective interconnection is referred to as programming since the logical function implemented by the programmable logic array is entered into the array by the floating gate driver transistors, 1001-1, 1001-2, . . . , 1001-N, that are used at the intersections of input lines 1012, and interconnect lines 1014 in the array.

In this embodiment, each of the interconnect lines 1014 acts as a NOR gate for the input lines 1012 that are connected to the interconnect lines 1014 through the floating gate driver transistors, 1001-1, 1001-2, . . . , 1001-N, of the array 1000. For example, interconnection line 1014A acts as a NOR gate for the signals on input lines 1012A, 1012B and 1012C. Programmability of the vertical floating gate driver transistors, 1001-1, 1001-2, . . . , 1001-N is achieved by charging the vertical floating gates. When the vertical floating gate is charged, that floating gate driver transistor, 1001-1, 1001-2, . . . , 1001-N will remain in an off state until it is reprogrammed. Applying and removing a charge to the vertical floating gates is discussed in more detail below. A floating gate driver transistors, 1001-1, 1001-2, . . . , 1001-N programmed in an off state remains in that state until the charge is removed from its vertical floating gate.

Floating gate driver transistors, 1001 - 1, 1001-2, . . . , 1001-N not having a corresponding vertical floating gate charged operate in either an on state or an off state, wherein input signals received by the input lines 1012A, 1012B and 1012C determine the applicable state. If any input lines 1012A, 1012B and 1012C is turned on by input signals received by the input lines 1012A, 1012B and 1012C, then a ground is provided to load device transistors 1016. The load device transistors 1016 are attached to the interconnect lines 1014. The load device transistors 1016 provide a low voltage level when any one of the floating gate driver transistors, 1001-1, 1001-2, . . . , 1001-N connected to the corresponding output line is activated. This performs the NOR logic circuit function, an inversion of the OR circuit function results from inversion of data onto the interconnect lines 1014 is through the floating gate driver transistors, 1001-1, 1001-2, . . . , 1001-N of the array 1000. When the floating gate driver transistors, 1001-1, 1001-2, . . . , 1001-N are in an off state, an open is provided to the drain of the load device transistors 1016. The VDD voltage level is applied to corresponding input lines, e.g. the interconnect lines 1014 for second logic plane 1022 when a load device transistors 1016 is turned on by a clock signal received at the gate of the load device transistors 1016 (Φ). Each of the floating gate driver transistors, 1001-1, 1001-2, . . . , 1001-N described herein are formed according to the teachings of the present invention as described in detail in connection with FIGS. 3A–8E.

In a similar manner, second logic plane 1022 comprises a second array of floating gate driver transistors, 1002-1, 1002-2, . . . , 1002-N that are selectively programmed to provide the second level of the two level logic needed to implement a specific logical function. In this embodiment, the array of floating gate driver transistors, 1002-1, 1002-2, . . . , 1002-N is also configured such that the output lines 1020 comprise a logical NOR function of the signals from the interconnection lines 1014 that are coupled to particular output lines through the floating gate driver transistors, 1002-1, 1002-2, . . . , 1002-N of the second logic plane 1022.

Programmability of the vertical floating gate driver transistors, 1002-1, 1002-2, . . . , 1002-N is achieved by charging the vertical floating gate. When the vertical floating gate is charged, that floating gate driver transistor, 1002-1, 1002-2, . . . , 1002-N will remain in an off state until it is reprogrammed. Applying and removing a charge to the vertical floating gates is discussed in more detail below. A floating gate driver transistors, 1002-1, 1002-2, . . . , 1002-N programmed in an off state remains in that state until the charge is removed from the vertical floating gate.

Floating gate driver transistors, 1002-1, 1002-2, . . . , 1002-N not having a corresponding vertical floating gate charged operate in either an on state or an off state, wherein signals received by the interconnect lines 1014 determine the applicable state. If any interconnect lines 1014 is turned on, then a ground is provided to load device transistors 1024 by applying a ground potential to the source line or conductive source plane coupled to the transistors first source/drain region as described herein. The load device transistors 1024 are attached to the output lines 1020. The load device transistors 1024 provide a low voltage level when any one of the floating gate driver transistors, 1002-1, 1002-2, . . . , 1002-N connected to the corresponding output line is activated. This performs the NOR logic circuit function, an inversion of the OR circuit function results from inversion of data onto the output lines 1020 through the floating gate driver transistors, 1002-1, 1002-2, . . . , 1002-N of the array 1000. When the floating gate driver transistors, 1002-1, 1002-2, . . . , 1002-N are in an off state, an open is provided to the drain of the load device transistors 1024. The VDD voltage level is applied to corresponding output lines 1020 for second logic plane 1022 when a load device transistor 1024 is turned on by a clock signal received at the gate of the load device transistors 1024 (Φ). In this manner a NOR-NOR electrically programmable logic array is most easily implemented utilizing the normal PLA array structure. Each of the floating gate driver transistors, 1002-1, 1002-2, . . . , 1002-N described herein are formed according to the teachings of the present invention as described in detail in connection with FIGS. 3A–8E.

Thus FIG. 10 shows the application of the novel, non-volatile floating gate transistors with ultra thin bodies in a logic array. If a floating gate driver transistors, 1001-1, 1001-2, . . . , 1001-N, and 1002-1, 1002-2, . . . , 1002-N, is programmed with a negative charge on the vertical floating gate it is effectively removed from the array. In this manner the array logic functions can be programmed even when the circuit is in the final circuit or in the field and being used in a system.

The absence or presence of stored charge on the floating gates is read by addressing the input lines 1012 or control gate lines and y-column/sourcelines to form a coincidence in address at a particular floating gate. The control gate line would for instance be driven positive at some voltage of 1.0 Volts and the y-column/sourceline grounded, if the floating gate is not charged with electrons then the vertical sidewall transistor would turn on tending to hold the interconnect line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read. In reality, data is read out in "bit pairs" by addressing not only a single floating gate but rather both of the floating gates in row adjacent pillars on each side of a particular control gate address line. Data is stored into the cell by hot electron injection. In this case, the interconnect line coupled to the ultra thin single crystalline vertical second source/drain region is driven with a higher drain voltage like 2 Volts for 0.1 micron technology and the control gate line is addressed by some nominal voltage in the range of twice this value. Hot electrons generated in the channel of the ultra thin single crystalline vertical floating gate transistor will be injected through the gate or tunnel oxide on to the floating gate of the transistor selected by the address scheme. Erasure is accomplished by driving the control gate line with a negative voltage and the sourceline of the transistor with a positive bias so the total voltage difference is in the order of 3 Volts causing electrons to tunnel off of the floating gates. According one embodiment of the present invention, data can be erased in "bit pairs" since both floating gates on each side of a control gate can be erased at the same time. This architecture is amenable to block address schemes where sections of the array are erased and reset at the same time.

Figure 11:
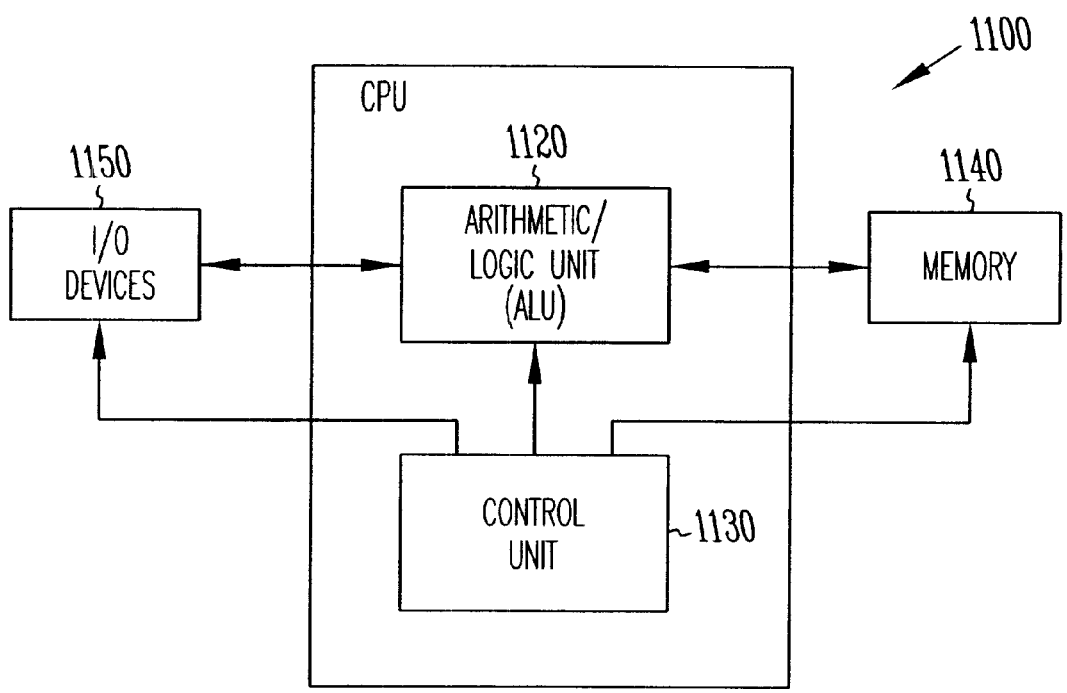
FIG. 11 is a simplified block diagram of a high-level organization of an electronic system according to the teachings of the present invention.

FIG. 11 is a simplified block diagram of a high-level organization of an electronic system 1100 according to the teachings of the present invention. As shown in FIG. 11, the electronic system 1100 is a system whose functional elements consist of an arithmetic/logic unit (ALU), e.g. processor 1120, a control unit 1130, a memory unit 1140, or memory device 1140, and an input/output (I/O) device 1150. Generally such an electronic system 1100 will have a native set of instructions that specify operations to be performed on data by the ALU 1120 and other interactions between the ALU 1120, the memory device 1140 and the I/O devices 1150. The memory devices 1140 contain the data plus a stored list of instructions.

The control unit 1130 coordinates all operations of the ALU 1120, the memory device 1140 and the I/O devices 1150 by continuously cycling through a set of operations that cause instructions to be fetched from the memory device 1140 and executed. In service programmable logic arrays, according to the teachings of the present invention, can be implemented to perform many of the logic functions performed by these components. With respect to the ALU 1120, the control unit 1130 and the I/O devices 1150, arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND.

CONCLUSION

The above structures and fabrication methods have been described, by way of example and not by way of limitation, with respect to in service programmable logic arrays with ultra thin body transistors. Different types of floating and control gate structures are shown which can be utilized on three different types of substrates to form the in service programmable logic arrays.

It has been shown that higher and higher density requirements in logic arrays result in smaller and smaller dimensions of the structures and transistors. Conventional planar transistor structures are difficult to scale to the deep sub-micron dimensional regime. The present invention provides floating gate transistors which are fabricated in ultra-thin single crystalline silicon films grown along the sidewall of an oxide pillar. These floating gate transistors with ultra-thin body regions scale naturally to smaller and smaller dimensions while preserving the performance advantage of smaller devices. The advantages of smaller dimensions for higher density and higher performance are both achieved in the programmable logic arrays of the present invention.

According to the teachings of the present invention, any arbitrary combinational logic function can be realized in the so-called sum-of-products form. A sum of products may be implemented by using a two level logic configuration such as the NOR-NOR arrays shown in FIG. 10, or by a combination of NOR gates and NAND gates. A NAND gate can be realized by a NOR gate with the inputs inverted. By disconnecting the first contact layers in the pillars, which are isolated from the substrate, these arrays can be field programmed or erased and re-programmed to accomplish the required logic functions.

What is claimed is:

1. An in-service programmable logic array, comprising:
   a first logic plane that receives a number of input signals, the first logic plane having a plurality of logic cells arranged in rows and columns that are interconnected to provide a number of logical outputs;
   a second logic plane having a number of logic cells arranged in rows and columns that receive the outputs of the first logic plane and that are interconnected to produce a number of logical outputs such that the in service programmable logic array implements a logical function; and
   wherein each of the logic cells includes;
      a vertical pillar extending outwardly from a semiconductor substrate, wherein each pillar includes a single crystalline first contact layer and a second contact layer separated by an oxide layer; and
      at least one single crystalline ultra thin vertical floating gate transistor that is selectively disposed adjacent the vertical pillar, wherein each single crystalline vertical floating gate transistor includes;
         an ultra thin single crystalline vertical first source/drain region coupled to the first contact layer;
         an ultra thin single crystalline vertical second source/drain region coupled to the second contact layer;
         an ultra thin single crystalline vertical body region which opposes the oxide layer and couples the first and the second source/drain regions; and
         a floating gate opposing the ultra thin single crystalline vertical body region.

2. The in service programmable logic array of claim 1, wherein the first logic plane and the second logic plane each comprise NOR planes.

3. The in service programmable logic array of claim 1, wherein the ultra thin single crystalline vertical body region includes a channel having a vertical length of less than 100 nanometers and wherein the ultra thin single crystalline vertical body region has a horizontal width of less than 10 nanometers.

4. The in service programmable logic array of claim 1, wherein the ultra thin single crystalline vertical body region is formed from solid phase epitaxial growth.

5. The in service programmable logic array of claim 1, wherein the single crystalline ultra thin vertical floating gate transistor includes a control gate that is formed in a trench adjacent to floating gate.

6. The in service programmable logic array of claim 1, wherein the single crystalline ultra thin vertical floating gate transistor includes a control gate that is located above the floating gate.

7. The in service programmable logic array of claim 1, wherein a trench separates adjacent rows of pillars and the trench houses an input line which serves as a control line for addressing the floating gates of selected transistors on either side of the trench.

8. The in service programmable logic array of claim 1, wherein a trench separates adjacent rows of pillars and the trench houses two floating gates for respective single crystalline ultra thin vertical floating gate transistors formed on opposing sides of the trench.

9. The in service programmable logic array of claim 1, wherein the ultra thin single crystalline vertical body region comprises a lightly doped body region such that the single crystalline ultra thin vertical floating gate transistor functions as a fully depleted transistor.

10. The in service programmable logic array of claim 1, wherein the single crystalline first contact layers of the pillars are coupled together.

11. A programmable logic array, comprising:
   a plurality of input lines for receiving an input signal;
   a plurality of output lines; and
   one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to a received input signal, wherein each logic cell includes:
      an ultra thin single crystalline vertical first source/drain region;
      an ultra thin single crystalline vertical second source/drain region;
      an ultra thin single crystalline vertical body region which couples the first and the second source/drain regions;
      wherein a horizontal junction depth for the first and the second ultra thin single crystalline vertical source/drain regions is much less than a vertical length of the ultra thin single crystalline vertical body region; and
      a floating gate opposing the ultra thin single crystalline vertical body region.

12. A programmable logic array, comprising:
   a plurality of input lines for receiving an input signal;
   a plurality of output lines; and
   one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to a received input signal, wherein each logic cell includes:
      a vertical pillar extending outwardly from a semiconductor substrate, wherein the pillar includes a single crystalline first contact layer and a second contact layer separated by an oxide layer;
      at least one single crystalline ultra thin vertical floating gate transistor disposed adjacent the vertical pillar, wherein the at least one single crystalline vertical floating gate transistor includes;
         an ultra thin single crystalline vertical first source/drain region coupled to the first contact layer;
         an ultra thin single crystalline vertical second source/drain region coupled to the second contact layer;
         an ultra thin single crystalline vertical body region which opposes the oxide layer and couples the first and the second source/drain regions; and
         a floating gate opposing the ultra thin single crystalline vertical body region.

13. The programmable logic array of claim 12, wherein each input line integrally forms a control gate for addressing the floating gate.

14. The programmable logic array of claim 12, wherein each input line integrally forms a control gate formed in a trench opposing the floating gate.

15. The programmable logic array of claim 12, wherein each ultra thin single crystalline vertical body region includes a p-type channel having a vertical length of less than 100 nanometers.

16. The programmable logic array of claim 12, wherein the programmable logic array includes a number of buried source lines which are formed integrally with the first contact layer and are separated from the semiconductor substrate by an oxide layer.

17. The programmable logic array of claim 12, wherein each input line includes a horizontally oriented input line having a vertical side length of less than 100 nanometers.

18. The programmable logic array of claim 12, wherein each input line includes a vertically oriented input line having a vertical length of less than 100 nanometers.

19. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
a vertical pillar extending outwardly from a semiconductor substrate, wherein the pillar includes a single crystalline first contact layer and a second contact layer separated by an oxide layer;
a pair of single crystalline ultra thin vertical transistors formed along opposing sides of the pillar, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions;
wherein a surface space charge region for the single crystalline vertical transistor scales down as other dimensions of the transistor scale down; and
a floating gate opposing the ultra thin single crystalline vertical body region, and wherein the floating gate is formed in a trench between rows of the number of pillars and is shared between the ultra thin single crystalline vertical floating gate transistors that are adjacent the trench in column adjacent pillars;
a plurality of buried source lines formed of single crystalline semiconductor material and disposed below the pillars in the array for interconnecting with the first contact layer of pillars in the array; and
wherein each of the number of input lines is disposed between rows of the pillars and opposes the floating gates of the single crystalline vertical floating gate transistors for serving as a control gate.

20. The programmable logic array of claim 19, wherein each ultra thin single crystalline vertical body region includes a p-type channel having a vertical length of less than 100 nanometers.

21. The programmable logic array of claim 19, wherein the number of buried source lines are formed integrally with the first contact layer and are separated from the semiconductor substrate by an oxide layer.

22. The programmable logic array of claim 19, wherein each input line includes a horizontally oriented input line having and is separated from the floating gates by an insulator layer.

23. A low voltage programmable logic array, comprising:
a number of input lines for receiving an input signal;
a number of output lines; and a first logic plane that receives a number of input signals on the number of input lines, the first logic plane having a number of logic cells arranged in rows and columns that are interconnected to provide a number of logical outputs;
a second logic plane coupled to the first logic plane by a number of interconnect lines, the second logic plane having a number of logic cells arranged in rows and columns that receive the outputs of the first logic plane on the interconnect lines and that are interconnected to produce a number of logical outputs on the output lines such that the programmable logic array implements a logical function;
wherein each logic cell includes:
a vertical pillar extending outwardly from a semiconductor substrate at intersections of the input lines and interconnect lines and at the intersections of the interconnect lines and the output lines, wherein each pillar includes a single crystalline first contact layer and a second contact layer separated by an oxide layer; and
a number of single crystalline ultra thin vertical transistors formed along selected sides of each pillar, wherein each single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region which opposes the oxide layer and couples the first and the second source/drain regions; and
a floating gate opposing the vertical body region and separated therefrom by a tunnel oxide;
a number of buried source lines formed of single crystalline semiconductor material and disposed below the pillars in the array for interconnecting with the first contact layer of column adjacent pillars in the array.

24. The low voltage programmable logic array of claim 23, wherein the number of input lines are disposed in a trench between rows of the pillars in the first logic plane and oppose the floating gates of the single crystalline vertical transistors for serving as control gates, and wherein the number of interconnect lines couple to the second contact layer in columns of pillars for implementing a logic function in the first logic plane.

25. The low voltage programmable logic array of claim 23, wherein the number of interconnect lines are disposed in a trench between rows of the pillars in the second logic plane and oppose the floating gates of the single crystalline vertical transistors for serving as control gates, and wherein the number of output lines couple to the second contact layer in columns of pillars for implementing a logic function in the second logic plane.

26. The low voltage programmable logic array of claim 23, wherein column adjacent pillars are separated by a trench and each trench includes a pair of floating gates opposing the ultra thin single crystalline vertical body regions on opposite sides of the trench.

27. The low voltage programmable logic array of claim 26, wherein each of the input lines in the first logic plane includes a vertically oriented input line formed in the trench between the pair of floating gates for serving as a control gate.

28. The low voltage programmable logic array of claim 26, wherein each of the interconnect lines in the second logic plane includes a vertically oriented interconnect line formed in the trench between the pair of floating gates for serving as a control gate.

29. The low voltage programmable logic array of claim 26, wherein each of the input lines in the first logic plane includes a horizontally oriented input line located above the pair of floating gates for serving as a control gate.

30. The low voltage programmable logic array of claim 26, wherein a pair of input lines are formed above the pair of floating gates in each trench in the first logic plane for serving as control lines, and a pair of interconnect lines are formed above the pair of floating gates in each trench in the second logic plane for serving as control lines.

31. The low voltage programmable logic array of claim 23, wherein each single crystalline vertical transistor has a vertical length of less than 100 nanometers and a horizontal width of less than 10 nanometers.

32. An electronic system, comprising:
a memory;
a processor coupled to the memory; and
wherein the processor includes at least one in service programmable logic array including:
  a first logic plane that receives a number of input signals, the first logic plane having a plurality of logic cells arranged in rows and columns that are interconnected to provide a number of logical outputs;
  a second logic plane having a number of logic cells arranged in rows and columns that receive the outputs of the first logic plane and that are interconnected to produce a number of logical outputs such that the programmable logic array implements a logical function; and
wherein each of the logic cells includes;
  a vertical pillar extending outwardly from a semiconductor substrate, wherein each pillar includes a single crystalline first contact layer and a second contact layer separated by an oxide layer; and
  at least one single crystalline ultra thin vertical transistor that is selectively disposed adjacent the vertical pillar, wherein each single crystalline vertical transistor includes;
    an ultra thin single crystalline vertical first source/drain region coupled to the first contact layer;
    an ultra thin single crystalline vertical second source/drain region coupled to the second contact layer;
    an ultra thin single crystalline vertical body region which opposes the oxide layer and couples the first and the second source/drain regions; and
    a floating gate opposing the vertical body region and separated therefrom by a tunnel oxide.

33. The electronic system of claim 32, wherein the first logic plane and the second logic plane each comprise NOR planes.

34. The electronic system of claim 32, wherein the ultra thin single crystalline vertical body region includes a channel having a vertical length of less than 100 nanometers and wherein the ultra thin single crystalline vertical body region has a horizontal width of less than 10 nanometers.

35. The electronic system of claim 32, wherein the ultra thin single crystalline vertical body region is formed from solid phase epitaxial growth.

36. The electronic system of claim 32, wherein the single crystalline ultra thin vertical transistor includes a vertically oriented floating gate that is formed in a trench adjacent to the ultra thin single crystalline vertical body region.

37. The electronic system of claim 32, wherein each pillar includes a pair of single crystalline ultra thin vertical transistors formed on opposing sides of the pillar, and wherein each single crystalline ultra thin vertical transistor includes a floating gate that is formed in a trench adjacent to the ultra thin single crystalline vertical body region on opposite sides of the pillar.

38. The electronic system of claim 37, wherein the trench separates adjacent rows of pillars in the first logic plane and the trench houses an input line that serves as a control gate for addressing the floating gates of the transistors in column adjacent pillars on either side of the trench.

39. The electronic system of claim 37, wherein a pair of input lines are formed opposing the pair of floating gates in each trench in the first logic plane for serving as control lines, and a pair of interconnect lines are formed opposing the pair of floating gates in each trench in the second logic plane for serving as control lines.

40. The electronic system of claim 32, wherein each ultra thin single crystalline vertical body region comprises a lightly doped body region such that the single crystalline ultra thin vertical transistor functions as a fully depleted transistor.

41. The electronic system of claim 32, wherein the single crystalline first contact layers of the pillars are coupled together.

42. An electronic system, comprising:
a memory;
a processor coupled to the memory; and
wherein the processor includes at least one programmable logic array including:
  one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
    an ultra thin single crystalline vertical first source/drain region;
    an ultra thin single crystalline vertical second source/drain region;
    an ultra thin single crystalline vertical body region which couples the first and the second source/drain regions; and
    wherein a horizontal junction depth for the first and the second ultra thin single crystalline vertical source/drain regions is much less than a vertical length of the ultra thin single crystalline vertical body region; and
    a floating gate opposing the vertical body region and separated therefrom by a tunnel oxide.

43. An electronic system, comprising:
a memory;
a processor coupled to the memory; and
wherein the processor includes at least one programmable logic array including:
  a number of input lines for receiving an input signal;
  a number of output lines; and
  one or more arrays having a first logic plane and a second logic plane connected between the input lines and the output lines, wherein the first logic plane and the second logic plane comprise a number of logic cells arranged in rows and columns for providing a sum-of-products term on the output lines responsive to the received input signal, wherein each logic cell includes:

a vertical pillar extending outwardly from a semiconductor substrate, wherein each pillar includes a single crystalline first contact layer and a second contact layer separated by an oxide layer; and a number of single crystalline ultra thin vertical transistor that are disposed adjacent the vertical pillar, wherein each single crystalline vertical transistor includes;

an ultra thin single crystalline vertical first source/drain region coupled to the first contact layer;

an ultra thin single crystalline vertical second source/drain region coupled to the second contact layer; and an ultra thin single crystalline vertical body region which opposes the oxide layer and couples the first and the second source/drain regions; and a floating gate opposing the vertical body region and separated therefrom by a tunnel oxide.

44. The electronic system of claim 43, wherein each input line integrally forms a control gate and opposes the floating gates of the single crystalline vertical transistors in the first logic plane.

45. The electronic system of claim 43, wherein each output line is coupled to the second layer in row adjacent pillars in the second logic plane.

46. The electronic system of claim 43, wherein each ultra thin single crystalline vertical body region includes a p-type channel having a vertical length of less than 100 nanometers.

47. The electronic system of claim 43, wherein the programmable logic array includes a number of buried source lines which are formed integrally with the first contact layer and are separated from the semiconductor substrate by an oxide layer.

48. The electronic system of claim 43, wherein each input line includes a horizontally oriented input line having a vertical side length of less than 100 nanometers.

49. The electronic system of claim 43, wherein each input line includes a vertically oriented input line having a vertical length of less than 100 nanometers.

50. An electronic system, comprising:
a memory;
a processor coupled to the memory; and
wherein at least one of the processor and memory include a programmable logic array including:
a number of input lines for receiving an input signal;
a number of output lines;
a first logic plane that receives a number of input signals on the number of input lines, the first logic plane having a number of logic cells arranged in rows and columns that are interconnected to provide a number of logical outputs;
a second logic plane coupled to the first logic plane by a number of interconnect lines, the second logic plane having a number of logic cells arranged in rows and columns that receive the outputs of the first logic plane on the interconnect lines and that are interconnected to produce a number of logical outputs on the output lines such that the programmable logic array implements a logical function;
wherein each logic cell includes:
a vertical pillar extending outwardly from a semiconductor substrate at intersections of the input lines and interconnect lines and at the intersections of the interconnect lines and the output lines, wherein each pillar includes a single crystalline first contact layer and a second contact layer separated by an oxide layer; and a number of single crystalline ultra thin vertical transistors formed along selected sides of each pillar, wherein each single crystalline vertical transistor includes;

an ultra thin single crystalline vertical first source/drain region coupled to the first contact layer;

an ultra thin single crystalline vertical second source/drain region coupled to the second contact layer;

an ultra thin single crystalline vertical body region which opposes the oxide layer and couples the first and the second source/drain regions; and a floating gate formed in a trench opposing the vertical body region and separated therefrom by a gate oxide;

a number of buried source lines formed of single crystalline semiconductor material and disposed below the pillars in the array for interconnecting with the first contact layer of pillars in the array.

51. The electronic system of claim 50, wherein the number of input lines are disposed between rows of the pillars in the first logic plane for addressing floating gates of the single crystalline vertical transistors in the trench, and wherein the number of interconnect lines couple to the second contact layer in rows of pillars in the first logic plane for implementing a logic function in the first logic plane.

52. The electronic system of claim 50, wherein the number of interconnect lines are disposed between rows of the pillars in the second logic plane for addressing floating gates of the single crystalline vertical transistors in the trench, and wherein the number of output lines couple to the second contact layer in rows of pillars in the second logic plane for implementing a logic function in the second logic plane.

53. The electronic system of claim 51, wherein each input line includes a vertically oriented input line having a vertical length of less than 100 nm and disposed in the trench between a pair of floating gates on opposing sides of the trench in the first logic plane.

54. The electronic system of claim 52, wherein each interconnect line includes a vertically oriented interconnect line having a vertical length of less than 100 nm and disposed in the trench between a pair of floating gates on opposing sides of the trench in the second logic plane.

55. The electronic system of claim 50, wherein each single crystalline vertical transistor has a vertical length of less than 100 nanometers and a horizontal width of less than 10 nanometers.

56. A method for forming a programmable logic array, comprising:
forming a first logic plane that receives a number of input signals, wherein forming the first logic plane includes forming a number of logic cells arranged in rows and columns that are interconnected to provide a number of logical outputs;
forming a second logic plane, wherein forming the second logic plane includes forming a number of logic cells arranged in rows and columns that receive the outputs of the first logic plane and that are interconnected to produce a number of logical outputs such that the programmable logic array implements a logical function; and
wherein forming each of the logic cells includes;

forming a vertical pillar extending outwardly from a semiconductor substrate, wherein forming each pillar includes forming a single crystalline first contact layer and a second contact layer of a first conductivity type separated by an oxide layer; and forming a single crystalline ultra thin vertical transistor that is disposed adjacent the vertical pillar, wherein forming the single crystalline vertical transistor includes;

depositing a lightly doped polysilicon layer of a second conductivity type over the pillar and directionally etching the polysilicon layer of the second conductivity type to leave only on sidewalls of the pillars;

annealing the pillar such that the lightly doped polysilicon layer of the second conductivity type recrystallizes and lateral epitaxial solid phase regrowth occurs vertically to form a single crystalline vertically oriented material of the second conductivity type; and wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type; and forming a floating gate opposing the vertical body region and separated therefrom by a gate oxide.

57. The method of claim 56, wherein forming the first logic plane and the second logic plane each comprise forming NOR planes.

58. The method of claim 56, wherein forming the single crystalline vertical transistor includes forming a single crystalline vertical transistor having a vertical length of less than 100 nanometers and a horizontal width of less than 10 nanometers.

59. The method of claim 56, wherein forming the single crystalline ultra thin vertical transistor includes forming a control gate opposing the floating gate for receiving the number of input signals.

60. The method of claim 56, wherein forming the single crystalline ultra thin vertical transistor includes forming a pair of single crystalline ultra thin vertical transistors on opposing sides of each pillar, and forming a floating gate in a trench adjacent to the ultra thin single crystalline vertical body region on opposite sides of the pillar.

61. The method of claim 56, wherein the method includes forming a trench which separates adjacent rows of pillars, and wherein forming the trench includes forming an input line in the trench which opposes the floating gates of the ultra thin single crystalline vertical transistors on either side of the trench.

62. The method of claim 56, wherein the method further includes forming a pair of input lines disposed above the floating gates between rows of pillars for receiving the input signals and for serving as control gates to the ultra thin single crystalline vertical transistors in the first logic plane.

63. The method of claim 56, wherein forming the ultra thin single crystalline vertical body region comprises forming a lightly doped body region such that the single crystalline ultra thin vertical transistor functions as a fully depleted transistor.

64. The method of claim 56, wherein forming the single crystalline first contact layer includes integrally forming a more heavily doped source line which couples the first contact layer in column adjacent pillars together.

65. A method for forming an in service programmable logic array, comprising:

forming a plurality of input lines for receiving an input signal;

forming a plurality of output lines; and forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes:

forming an ultra thin single crystalline vertical first source/drain region;

forming an ultra thin single crystalline vertical second source/drain region;

forming an ultra thin single crystalline vertical body region which couples the first and the second source/drain regions;

wherein forming each logic cell includes forming a horizontal junction depth for the first and the second ultra thin single crystalline vertical source/drain regions which is much less than a vertical length of the ultra thin single crystalline vertical body region; and forming a floating gate opposing the vertical body region and separated therefrom by a gate oxide.

66. A method for forming a programmable logic array, comprising:

forming a plurality of input lines for receiving an input signal;

forming a plurality of output lines; and forming one or more arrays having a first logic plane and a second logic plane connected between the input lines and the output lines, wherein forming the first logic plane and the second logic plane includes forming a plurality of logic cells arranged in rows and columns for providing a sum-of-products term on the output lines responsive to the received input signal, wherein forming each logic cell includes:

forming a pillar extending outwardly from a semiconductor substrate, wherein forming each pillar includes forming a single crystalline first contact layer and a second contact layer separated by an oxide layer; and forming a single crystalline ultra thin vertical transistor which is disposed adjacent the vertical pillar, wherein forming the single crystalline vertical transistor includes;

depositing a lightly doped polysilicon layer of a second conductivity type over each pillar and directionally etching the polysilicon layer of the second conductivity type to leave only on sidewalls of the pillars;

annealing the pillar such that the lightly doped polysilicon layer of the second conductivity type recrystallizes and lateral epitaxial solid phase regrowth occurs vertically to form a single crystalline vertically oriented material of the second conductivity type; and wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type; and forming a floating gate opposing the vertical body region and separated therefrom by a gate oxide.

67. The method of claim 66, wherein forming each input line includes integrally forming a control gate which opposes the floating gate of the single crystalline ultra thin vertical transistor.

68. The method of claim 66, wherein forming the ultra thin single crystalline vertical body region of a second conductivity type includes forming a p-type body region having a vertical length of less than 100 nanometers.

69. The method of claim 66, wherein forming the programmable logic array further includes forming a number of buried source lines which are formed integrally with the first contact layer and are separated from the semiconductor substrate by an oxide layer.

70. The method of claim 66, wherein forming each input line includes forming a horizontally oriented input line located above each floating gate between rows of pillars and which is separated from the floating by an insulator layer.

71. The method of claim 66, wherein forming each input line includes forming a vertically oriented input line which opposes the floating gates disposed in a trench between rows of pillars, and wherein each input line has a vertical length of less than 100 nanometers.

72. A method of forming a low voltage programmable logic array, comprising:

forming a number of input lines for receiving an input signal;

forming a number of output lines;

forming a first logic plane that receives a number of input signals on the number of input lines, wherein forming the first logic plane includes forming a number of logic cells arranged in rows and columns that are interconnected to provide a number of logical outputs;

forming a second logic plane coupled to the first logic plane by forming a number of interconnect lines, wherein forming the second logic plane includes forming a number of logic cells arranged in rows and columns that receive the outputs of the first logic plane on the interconnect lines and that are interconnected to produce a number of logical outputs on the output lines such that the programmable logic array implements a logical function;

wherein forming each logic cell includes;

forming a vertical pillar extending outwardly from a semiconductor substrate at intersections of the input lines and interconnect lines and at the intersections of the interconnect lines and the output lines, wherein forming each pillar includes forming a single crystalline first contact layer and a second contact layer separated by an oxide layer; and forming a pair of single crystalline ultra thin vertical transistors on opposing each pillar, wherein forming each single crystalline vertical transistor includes;

depositing a lightly doped polysilicon layer of a second conductivity type over each pillar and directionally etching the polysilicon layer of the second conductivity type to leave only on sidewalls of the pillars;

annealing the pillar such that the lightly doped polysilicon layer of the second conductivity type recrystallizes and lateral epitaxial solid phase regrowth occurs vertically to form a single crystalline vertically oriented material of the second conductivity type; and wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type; and forming a floating gate opposing the vertical body regions and separated therefrom by a gate oxide; and forming a number of buried source lines formed of single crystalline semiconductor material and disposed below the pillars in the array for interconnecting with the first contact layer of pillars in the array.

73. The method of claim 72, wherein forming the number of input lines includes forming the number of input lines disposed in a trench between rows of the pillars in the first logic plane for addressing the floating gates of the single crystalline vertical transistors that are adjacent to the trench on opposing sides of the trench, and wherein forming the number of interconnect lines includes coupling the number of interconnect lines to the second contact layer in row of pillars for implementing a logic function in the first logic plane.

74. The method of claim 72, wherein forming the number of interconnect lines includes forming the number of interconnect lines disposed in a trench between rows of the pillars in the second logic plane for addressing the floating gates of the single crystalline vertical transistors that are adjacent to the trench on opposing sides of the trench, and wherein the forming the number of output lines includes coupling the number of output lines to the second contact layer in rows of pillars for implementing a logic function in the second logic plane.

75. The method of claim 73, wherein forming the number of input lines includes forming includes forming vertically oriented input lines having a vertical length of less than 100 nanometers.

76. The method of claim 72, wherein forming the number of interconnect lines includes forming horizontally oriented interconnect lines disposed between rows of pillars in the second logic plane for serving as control lines opposing the floating gates in the second logic plane.

77. The method of claim 72, wherein forming each single crystalline vertical transistor includes forming a single crystalline vertical transistor having a vertical length of less than 100 nanometers and a horizontal width of less than 10 nanometers.

* * * * *

UNITED STATES PATENT AND TRADEMARK OFFICE
CERTIFICATE OF CORRECTION

PATENT NO. : 6,377,070 B1  
DATED : April 23, 2002  
INVENTOR(S) : Leonard Forbes It is certified that error appears in the above-identified patent and that said Letters Patent is hereby corrected as shown below:

Column 3,  
Line 54, delete "," after "invention" and insert -- . --, therefor.

Column 9,  
Line 46, insert -- , -- after "6A".

Column 11,  
Line 12, delete "(e.g.)100nm)" and insert -- (e.g. 100 nm) --, therefor.  
Line 43, delete "A" before "oxide" and insert -- An --, therefor.

Column 13,  
Line 1, delete "A" before "oxide" and insert -- An --, therefor.  
Line 53, delete "know" and insert -- known --, therefor.  
Line 62, delete "know" and insert -- known --, therefor.  
Line 64, delete "can" before "then".

Column 15,  
Line 23, delete "1002N" and insert -- 1002-N --, therefor.  
Line 25, delete "1002N" and insert -- 1002-N --, therefor.

Column 16,  
Line 34, delete "is" after -- 1004 --.

Column 18,  
Line 3, insert -- to -- after "According".

Column 30,  
Line 50, delete second instance of "includes forming" before "vertically".

Signed and Sealed this

Eighth Day of October, 2002

*Attest:*

*Attesting Officer*

JAMES E. ROGAN  
*Director of the United States Patent and Trademark Office*